United States Patent
Lin et al.

(10) Patent No.: US 6,774,395 B1
(45) Date of Patent: Aug. 10, 2004

(54) APPARATUS AND METHODS FOR CHARACTERIZING FLOATING BODY EFFECTS IN SOI DEVICES

(75) Inventors: Hung-Jen Lin, Sunnyvale, CA (US); W Eugene Hill, Moss Beach, CA (US); Mario M. Pelella, Mountain View, CA (US); Chern-Jann Lee, Los Altos, CA (US); Srikanth Sundararajan, Sunnyvale, CA (US); Siu May Ho, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 10/345,007

(22) Filed: Jan. 15, 2003

(51) Int. Cl.[7] .......................... H01L 23/58; H01L 21/66
(52) U.S. Cl. ............................ 257/48; 438/18; 700/121
(58) Field of Search .................. 257/48, 347; 700/121; 324/765, 537; 438/314, 17, 18, 317

(56) References Cited

U.S. PATENT DOCUMENTS

| | | |
|---|---|---|
| 4,719,608 A | 1/1988 | Genat et al. |
| 5,457,400 A | 10/1995 | Ahmad et al. |
| 5,619,463 A | 4/1997 | Malhi |
| 5,952,891 A | 9/1999 | Boudry |
| 5,995,011 A | 11/1999 | Kurihara et al. |
| 6,078,058 A | 6/2000 | Hsu et al. |
| 6,239,591 B1 * | 5/2001 | Bryant et al. ............ 324/158.1 |
| 6,392,855 B1 | 5/2002 | Kuang et al. |
| 6,466,082 B1 * | 10/2002 | Krishnan .................... 327/543 |
| 6,498,370 B1 * | 12/2002 | Kim et al. ................... 257/347 |
| 6,535,015 B1 * | 3/2003 | Krishnan et al. ........... 324/769 |

* cited by examiner

Primary Examiner—Craig A. Thompson
(74) Attorney, Agent, or Firm—Eschweiler & Associates, LLC

(57) ABSTRACT

Methods are described for characterizing floating body delay effects in SOI wafers comprising providing a pulse edge to a floating body and a tied body chain in the wafer, storing tied body chain data according to one or more of the floating body devices, and characterizing the floating body delay effects according to the stored tied body chain data. Test apparatus are also described comprising a floating body chain including a plurality of series connected floating body inverters or NAND gates fabricated in the wafer and a tied body chain comprising a plurality of series connected tied body devices to in the wafer. Storage devices are coupled with the tied body devices and with one or more of the floating body devices and operate to store tied body chain data from the tied body devices according to one or more signals from floating body chain.

25 Claims, 12 Drawing Sheets

250 ⇁

First latching by the rising edge at the 14th stage, the pattern in the even-numbered FF's:
Initial         0*0*0*0*0*0*0*0*......*0*0*0
After         1*1*1*1*1*0*0*0*......*0*0*0
                    8th stage Second latching by the rising edge at the 114th stage, the pattern in the odd-numbered FF's:
Initial         *1*1*1*......*1*1*1*1*1*......*1*1*1
After         *0*0*0*......*0*0*0*1*1*......*1*1*1
                      45th stage

APPARATUS AND METHODS FOR CHARACTERIZING FLOATING BODY EFFECTS IN SOI DEVICES

FIELD OF INVENTION

The present invention relates generally to semiconductor device processing and more particularly to apparatus and methods for determining or characterizing floating body effects such as hysteretic propagation delays in SOI devices.

BACKGROUND OF THE INVENTION

A continuing trend in the semiconductor manufacturing industry is toward smaller and faster transistor devices, which consume less power. Toward that end, device scaling is a continuous design goal, wherein device features sizes and spaces are reduced. However, performance limits are reached in technologies where scaled transistors and other electrical devices are formed directly in a wafer substrate, such as silicon. These are sometimes referred to as bulk devices. To surpass the performance limitations of bulk devices, recent scaling efforts have included the use of silicon over oxide (SOI) wafers, in which a silicon layer overlies an insulator layer above a silicon substrate. SOI wafers may be fabricated according to known SOI wafer manufacturing techniques, such as SIMOX, bond-and-etch-back and smart-cut technology.

In SOI wafers, the active semiconductor regions of the wafer arc formed in the silicon on top of the oxide insulator, whereby these active regions are electrically isolated from one another. This technique achieves certain design advantages, such as a significant reduction in parasitic capacitances that exist in non-SOI (bulk) devices, as well as enhanced resistance to radiation damage. Partially depleted SOI devices are produced using one type of SO process in which the transistors are formed in a deposited semiconductor layer which is thick enough that the channel region will not be fully depleted through its full thickness when the device is in operation. The transistor design and operation in partially depleted SOI processes are similar to that of bulk CMOS devices.

Although SOI designs provide certain advantages over bulk designs, SOI devices suffer from certain effects related to the isolation of the active devices from the substrate material underlying the oxide layer, which are sometimes referred to as floating-substrate or floating body effects. In bulk transistors, the transistor body may be electrically connected through the substrate. In this case, the transistor body is at a relatively fixed potential, and consequently, the transistor threshold voltage is stable relative to the drain-to-source voltage. In many SOI transistors however, the body (e.g., the undepleted silicon under the gate) is electrically floating with respect to the substrate because of the intervening oxide insulator layer. Thus, when sufficient drain-to-body bias is applied to the transistor, impact ionization can generate electron-hole pairs near the drain. These electron-hole pairs cause a voltage differential to build up between the body node and the source of the transistor because majority carriers travel to the body while the minority carriers travel to the drain. The resulting voltage differential lowers the effective threshold voltage, thereby increasing the drain current.

The isolated body creates capacitive coupling between the body and the gate, between the body and the source, and between the body and the drain, in addition to diode couplings between the body and the source and between the body and the drain. These effects bias the body, creating a variation in the transistor threshold voltage during switching which is dependent upon the current and past states of the transistor. During switching, these effects bias the body through two mechanisms; capacitive coupling between the body and the gate, source, and drain, as well as charging and discharging between the body and the source and drain through diode coupling. This history dependent operation, sometimes referred to as hysteretic behavior, results from potentially large uncertainties in the floating body potential and, thus, uncertainties in the threshold voltage of devices due to unknown switching history.

These floating body effects can contribute to undesirable performance shifts in the transistor relative to design, as well as to increased instability of the transistor operating characteristics. In order to address these SOI floating body issues, some designs provide for electrical connection of the body or the source of an SOI transistor to the substrate. Transistors formed in this manner in an SOI wafer are sometimes referred to as tied body transistors. Although this technique serves to prevent body charging by creating a direct contact to the substrate, implementation of this approach complicates the device manufacturing process and also increases area overhead because tied body devices consume a larger area than floating body devices. Thus, most SOI designs must take these floating body effects into account.

Because these and other floating body issues affect end-product device performance, monitoring the hysteretic behavior of SOI devices is needed to refine and monitor the SOI manufacturing process. Thus, it is desirable to measure floating body effects in wafers at various points in a manufacturing process flow. One measure of the veracity of an SOI process is the propagation delays in switching a floating body transistor from one state to another. The threshold voltage of such floating body devices is dependent upon the body potential. The body potential, in turn, is dependent upon the current and past states of the transistor (e.g., the voltages at the various terminals of the device). Thus, the propagation delays are often measured at various voltages with switching signals of varying amounts of preconditioning, to obtain a curve of average propagation delay vs. time.

Typically, these measurements are obtained manually on a test bench, using oscilloscopes and high frequency probes to monitor floating body transistor switching delays under various conditions. Pulse generators are connected to the inputs of inverters or other floating body devices, which are formed of floating body MOS transistors, and the device outputs are monitored using the oscilloscope. Such testing is time consuming, and ill fitted for testing every wafer in a high throughput production setting. Thus, there is a need for improved apparatus and methods for measuring hysteretic propagation delay in SOI devices, which are amenable to automation using readily available, inexpensive test equipment.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention relates to apparatus and methodologies which may be employed to facilitate automated wafer testing to characterize hysteretic propagation delay and other floating body effects in SOI devices.

According to one aspect of the invention, test apparatus is provided, which comprises a floating body chain including a plurality of series connected floating body devices, such as inverters or NAND gates fabricated in a silicon over insulator (SOI) wafer and a reference delay chain comprising reference delay elements, such as tied body devices, connected in series in the wafer. The floating body comprises MOS transistors fabricated in the SO wafer. The reference delay elements may be some devices whose delay properties are switching-history independent, such as tied body inverters fashioned from MOS transistors having body regions or source regions electrically tied to the substrate. Storage elements such as edge-triggered registers or level-sensitive latches are formed in the wafer and coupled with the reference delay elements and with one or more of the floating body devices, where the storage elements operate to store reference delay chain data from the reference delay elements according to one or more signals from the floating body chain.

The storage elements may be divided into groups associated with odd and even reference delay elements, wherein the first group stores first reference delay data values from the odd numbered reference delay elements according to a first signal from the floating body chain and the second group stores second reference delay data from the even numbered reference delay elements according to a second signal. A pulse edge is applied to the floating body and reference delay chains, wherein the first control clock to the first group of the storage elements is provided when the pulse edge propagates through the floating body chain to a first floating body device, and the second clocking signal to the second group of the storage elements is provided when the pulse edge propagates through the floating body chain to a second (e.g., downstream) floating body device. A test system, such as a PC-based tester may then retrieve the first and second stored reference data, such as through a data interface in the wafer, and determine a first value representing a number of reference delay elements in the reference delay chain to which the pulse edge has propagated, as well as a second value representing a number of reference delay elements to which the pulse edge has propagated. A floating body delay value may then be determined according to the first and second values.

If the reference delay elements are implemented using tied body devices, prior to or following the provision of the pulse edge, and the tied body data loading, an odd number of the tied body devices may be selectively connected in a loop to operate as a ring oscillator for measuring a reference propagation delay value for use in evaluating the stored data In one example, a frequency divider is provided, which receives an output from one of the tied body devices in the tied body chain ring oscillator, along with a buffer receiving a divided count of transitions on the output of the tied body device from the frequency divider. This allows measurement of a tied body device propagation delay value. The loop is then decoupled, wherein the test pulse edge may then be applied to the tied body and floating body chains. The floating body delay value may then be determined according to the first and second values and according to the tied body device propagation delay value.

Another aspect of the invention provides test systems for characterizing floating body delay effects in an SOI wafer. The system comprises a floating body chain and a tied body chain, as well as a plurality of latches coupled with the tied body chain and with the floating body chain, wherein the latches are adapted to latch tied body chain data according to at least one of the floating body devices. The system further provides a tester comprising a pulse generator coupleable to the floating body and tied body chains so as to provide a pulse edge to first devices thereof. A processor is provided, which is coupleable to the latches to receive latched tied body chain data therefrom, and a power source is provided to power the devices in the wafer. The processor may control the pulse generator to selectively provide one or more pulse edges to the floating body and tied body chains and further determines at least one floating body delay value according to the tied body chain data from the latches.

Yet another aspect of the invention provides methods for fabricating an SOI wafer, comprising providing a plurality of series connected floating body devices in the wafer to form a floating body chain, providing a plurality of series connected tied body devices in the wafer to form a tied body chain, and providing a plurality of latches in the S wafer, where the latches are individually coupled with the tied body devices and with one or more of the floating body devices. The latches latch tied body chain data from the tied body devices according to the floating body device or devices in the floating body chain. The method further comprises providing one or more pulse input pads in the wafer, which are coupled with a first one of the floating body devices and with a first one of the tied body devices, as well as providing an interface coupled with the latches in the wafer to provide external access to the tied body chain data.

According to still another aspect of the invention, methods are provided for measuring or characterizing hysteretic propagation delay or other floating body delay effects in SOI devices. The methods comprise providing a pulse edge to a floating body and a tied body chain in an SOI wafer, storing tied body chain data according to one or more of the floating body devices, and characterizing the floating body delay effects, such as by determining one or more floating body delay values, according to latched tied body chain data. The tied body chain data storing may comprise storing first tied body chain data according to a first floating body device and storing second tied body chain data according to a second floating body device after storing the first tied body chain data.

In one implementation, first data states are latched from the tied body devices when the pulse edge propagates through the floating body chain to the first floating body device, and second data states are latched when the pulse edge propagates to the second floating body device, wherein the first states may represent odd numbered tied body device states and the second states represent even numbered tied body device states. First and second values may be determined from the latched data, which represent the number of tied body devices to which the pulse edge has propagated in the chain at the points in time where the pulse edge reaches the first and second floating body devices. These values are then used to determine a floating body delay value.

The method may further comprise coupling first and last tied body devices in the tied body chain to form a tied body chain ring oscillator, measuring a tied body device propagation delay value using the tied body chain ring oscillator, and decoupling the first and last tied body devices from one another in the tied body chain. In this instance, the floating body delay value may be determined according to the first and second values and according to the tied body device propagation delay value. Alternatively, or in combination, the method may also comprise providing one or more preconditioning pulses to the floating body chain and to the tied body chain before providing the pulse edge, so as to provide an indication of the floating body propagation delay in the presence of hysteretic preconditioning.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
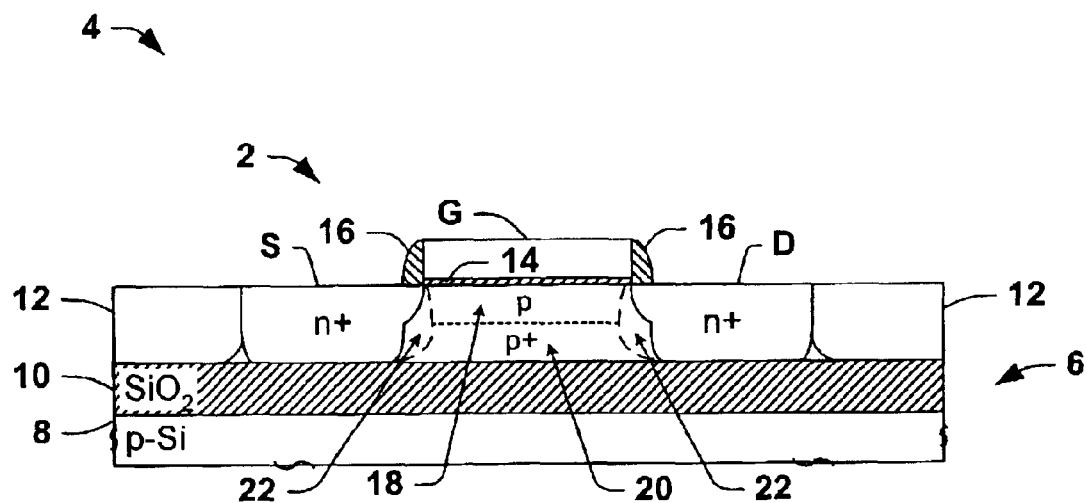
FIG. 1A is a partial side elevation view in section illustrating an exemplary floating body NMOS transistor fabricated in an SOI wafer.

One or more implementations of the present invention will now be described with reference to the drawings, wherein like reference numerals are used to refer to like elements throughout, and wherein the various structures are not necessarily drawn to scale. The present invention relates to methods and apparatus for characterizing floating body effects in SOI wafers, which may be implemented in PC-based testers and other types of automated test systems, and which may be employed to provide propagation delay information in a timely fashion. The various aspects of the invention are hereinafter illustrated and described in the context of partially depleted SOI devices and processes. However, it will be appreciated that the invention is not limited to use in association with such devices, and that alternative implementations are possible within the scope of the invention, wherein floating body effects are determined in non-partially depleted SOI devices.

Referring initially to FIGS. 1A–1D, an exemplary floating body NMOS transistor 2 is illustrated as part of a floating body inverter device 4 fabricated in an SOI wafer 6, wherein it is noted that the structures illustrated herein are not necessarily drawn to scale. A cross section of the transistor 2 is illustrated in FIG. 1A. The SOI wafer 6 in this example includes a p doped silicon substrate 8, over which is formed an insulating layer of $SiO_2$ 10. Silicon overlies the oxide layer 10, in which isolation structures 12 are formed. A polysilicon gate G is formed over a thin gate dielectric 14, having spacers 16 formed along the sidewalls thereof. A source region S and a drain region D are implanted and diffused with n+ dopants in one or more implantation steps, and an upper portion of p doped silicon 18 overlies a p+ doped body region 20 of the silicon under the gate G. Optional halo implant regions 22 are provided with p+ type dopants to reduce hot-carrier effects in the transistor 2.

Figure 1B:
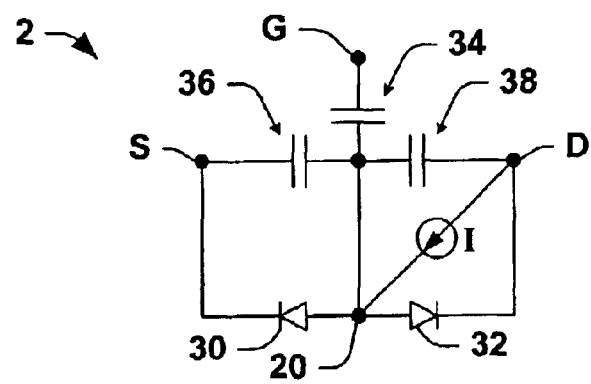
FIG. 1B is a schematic diagram illustrating a circuit representation of various floating body electrical characteristics of the NMOS transistor of FIG. 1A.

As discussed above, the floating body operation of the transistor 2 causes switching history dependent charging of the body region 20, and thus, hysteretic threshold voltage changes, depending upon the current and past states of the transistor 2. This is because the body region 20 is electrically isolated from the substrate 8 by the intervening oxide layer 10. FIG. 1B illustrates a schematic representation of the transistor 2, wherein the body region 20 is diode coupled to the source S and the drain D through diodes 30 and 32, respectively. In addition, the body region 20 is capacitively coupled to the gate G, the source S, and the drain D via capacitances 34, 36, and 38, respectively. A current source I in FIG. 1B represents generated holes injected into the body 20 from the drain D. Without a body contact (e.g., to tie the body 20 to the substrate 8 in FIG. 1A), the floating body 20 is allowed to electrically attain a voltage potential through various charging/discharging mechanisms, such as impact ionization current, drain-induced barrier lowering (DIBL), junction active and/or leakage currents, etc., as well as through capacitive coupling from the gate G, the source S, and the drain D during switching.

Figure 1C:
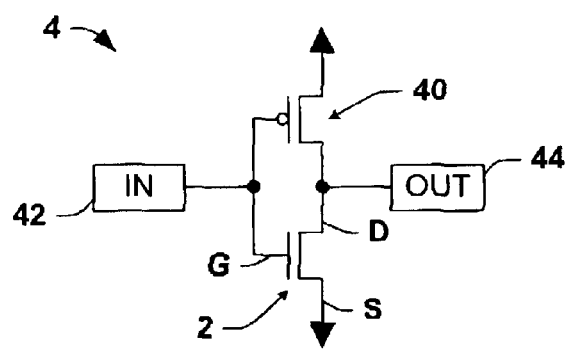
FIG. 1C is a schematic diagram illustrating an inverter device formed using the floating body NMOS device of FIGS. 1A and 1B and a floating body PMOS transistor.
Figure 1D:
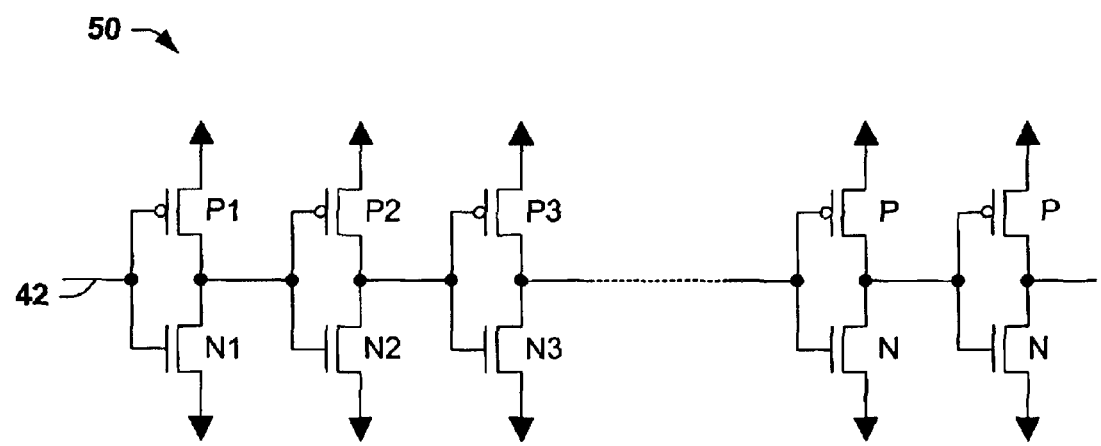
FIG. 1D is a schematic diagram illustrating an exemplary chain of floating body inverter devices.

An inverter circuit 4 in FIG. 1C includes the NMOS transistor 2, as well as a floating body PMOS transistor 40, to invert the signal level at an inverter input 42 to provide an output 44. In various cases of previous switching state history, the capacitive coupling via the capacitors 34, 36, and 38, the diode coupling via the diodes 30 and 32, and the current source I have different impacts on the floating body transistor 2 in the inverter device 4. In the case of a steady state DC condition, the input 42 is held constant for a relatively long enough period of time, wherein the capacitive coupling of capacitors 34, 36, and 38 has essentially no effect. Assuming the generated current I is negligible, the body potential of region 20 is determined by the DC solution of the body-to-drain and body-to-source diodes 32 and 34, respectively. For instance, it is assumed that a high logic level (HI) is 1.5V and a low (LO) level is 0V. If the input 42 is HI, the gate G of the NMOS transistor 2 is HI and the drain D and the source S are LO. In this situation, the body 20 is LO, wherein 0V is the DC solution of the two back-to-back connected diodes 30 and 32.

However, where the input 42 is LO, the drain D is HI and the gate G and the source S are LO. Ignoring the generated current I, the body 20 is charged by the reverse-biased body-to-drain junction leakage through the diode 32 and discharged by the weakly forward-biased body-to-source junction current through the diode 30. The body potential at 20 thus stabilizes at a value between LO and HI, depending on device properties, supply voltage and temperature, for example, about 0.25V. Due to the dependence of the threshold voltage of the transistor 2 on the bias at the body 20, the threshold voltage is lower for the same device with the gate G at LO (e.g., wherein higher body bias causes lower threshold voltage) than that at HI (e.g., lower body bias, higher threshold voltage). The converse is true for the PMOS transistor 40.

If a number of the devices 4 of FIG. 1C are cascaded to form an open chain 50 of floating body inverter devices, wherein the NMOS transistors N thereof are similar to the transistor 2 illustrated in FIGS. 1A–1C, and if the input 42 stays LO for a relatively long period of time, the transistors N1, P2, N3, etc. in the chain 50 have lower threshold voltages due to their bias condition, as compared to the devices, P1, N2, P3, etc. For example, the NMOS transistor N1 has the drain at HI and the gate and source at LO, wherein the body potential (e.g., body 20 of FIGS. 1A and 1B) is about 0.25V. Therefore, the threshold voltages of N1, N3 . . . are lower than those of N2, N4 . . . Likewise, the threshold voltages of P2, P4 . . . are lower than those of P1, P3 . . . .

Where a LO to HI or a HI to LO switch occurs at the input 42, starting from the DC state, for instance, if the input 42 stays LO for a relatively long period of time, and then goes through a LO/HI transition. In a dynamic switching, capacitive coupling (e.g., capacitors 34, 36, and 38 of FIG. 1B) also has an effect. During the LO/HI transition, the body 20 is capacitively coupled up by the gate G through the capacitor 34 (FIG. 1B) and the forward-biased body-to-source junction diode 30 discharges the body 20. As the gate voltage ramps up beyond the threshold voltage, the body 20 is not coupled up any further because of an inversion layer formed under the gate G. At the same time, the drain voltage drops, thereby coupling down the body potential at 20. If no further switching takes place, the body 20 will eventually return to the DC equilibrium, although this may take as long as several milliseconds because generation through the two reverse-biased diodes 30 and 32 is slow. Similarly, during the HI/LO transition, the gate voltage G initially has no effect on the body potential 20 due to the inversion layer shielding the body 20. The drain voltage at D increases as the gate voltage G decreases, thereby coupling up the body potential at 20. As the gate voltage G ramps down below the threshold voltage, the body 20 is coupled down, which takes a certain amount of time if no further pulses are provided to switch the input.

For a LO/HI/LO or HI/LO/HI pulse starting from an initial DC state, for instance, if the input 42 stays LO for a relatively long period of time and rises from the LO state, the rising edge arrives at the nth stage of the chain 50 with a delay equal to $t_{pd1}+t_{pu2}+t_{pd3}+Y+\tau_{pun}=n*(t_{pd1}+t_{pu2})/2$ where $t_{pd1}$, the pull-down delay of the first stage, is directly related to the body potential of the nth stage NMOS transistor prior to the first switch, and the pull-up delay $t_{pu2}$ is related to the body voltage of the second stage PMOS transistor P2 prior to the first switch. The body potential of the transistors N1 and of P2 will eventually return LO. However, if before full recovery, the input falls to the LO state, the falling-edge delay through the first n stages is equal to $t_{pu1}+t_{pd2}+t_{pu3}+ \ldots +t_{pdn}=n*(t_{pu1}+t_{pd2})/2$ where $t_{pu1}$ is the delay of the first stage, which is directly related to the body potential of P1 prior to the second switch and the second stage delay $t_{pd2}$ is related to the body voltage of the NMOS transistor N2 prior to the second switch.

The body potential of the transistor N2 is coupled up from 0V to about 0.4V after the first switch. If the input pulse width $(t_{f2}-t_{r2})$ is much less than the time required for the body 20 to return to the DC high value, then, prior to the second switch, the body voltage of N2 is between about 0.4V and about 0.25V. Thus, $t_{pd1}>t_{pd2}$ and, for the same reason, $t_{pu1}<t_{pu2}$. In addition, $t_{pd1}+t_{pu2}>t_{pu1}+t_{pd2}$ (e.g., the falling-edge propagation is faster than the rising edge propagation), and as a result, the input pulse width becomes compressed. Conversely, the input pulse width can stretch rather than compress if $t_{pd1}+t_{pu2}<t_{pu1}+t_{pd2}$.

Thus, the delay variation is determined by the relative magnitude of the four fundamental delays $t_{pd1}$, $t_{pu2}$, $t_{pu1}$ and $t_{pd2}$, which are related to the transient body voltage. The stretch is possible by decreasing coupling-down between the body 20 and the drain D (FIGS. 1A and 1B) and increasing the coupling-up between the body 20 and the gate G. In this regard, some relevant adjustment parameters include the ratio of the body-to-gate capacitance 34 to the body-to-source capacitance 36, the design threshold voltages, the properties of the body-junction diodes 30 and 32, the generation and/or recombination rate of the body 20, the Wp/Wn ratio between PMOS and NMOS transistors 40 and 2, the pulse input switching frequency, duty cycle, slew rate (e.g., rise/fall time), the power supply voltage, and the temperature, etc. Similar relationships are found for a HI/LO/HI input pulse case.

In the case of periodic pulses, after a first switch of a LO/HI/LO pulse, the body potential of the transistor N1 in the chain 50 (FIG. 1D) is coupled down from the DC-HI level 0.25V to an AC dynamic level of about −1.5V. The second input switch couples up the body 20 to a level that is slightly lower than 0.4V, e.g., the AC dynamic level coupled up from the DC-LO level of 0V, but still slightly higher than the DC-HI level of about 0.3V. If another pulse follows, the first switch of the second pulse couples down the body 20 to a level that is slightly higher than −1.5V, e.g., the AC dynamic level coupled down from the DC-HI level 0.25V, but still lower than the DC-LO level of 0V. The second switch of the second pulse couples up the body 20 to a level that is slightly lower than the AC dynamic coupled-up level at the second switch of the first pulse, but still higher than the DC-HI level of 0.25V. If the circuit switches constantly, the body potential at 20 will reach a steady state value, whereat $t_{pd1}=t_{pd2}$ and $t_{pu1}=t_{pu2}$, regardless of the initial DC-HI or DC-LO state. Thus, at AC steady state, there is substantially no delay variation.

Figure 2:
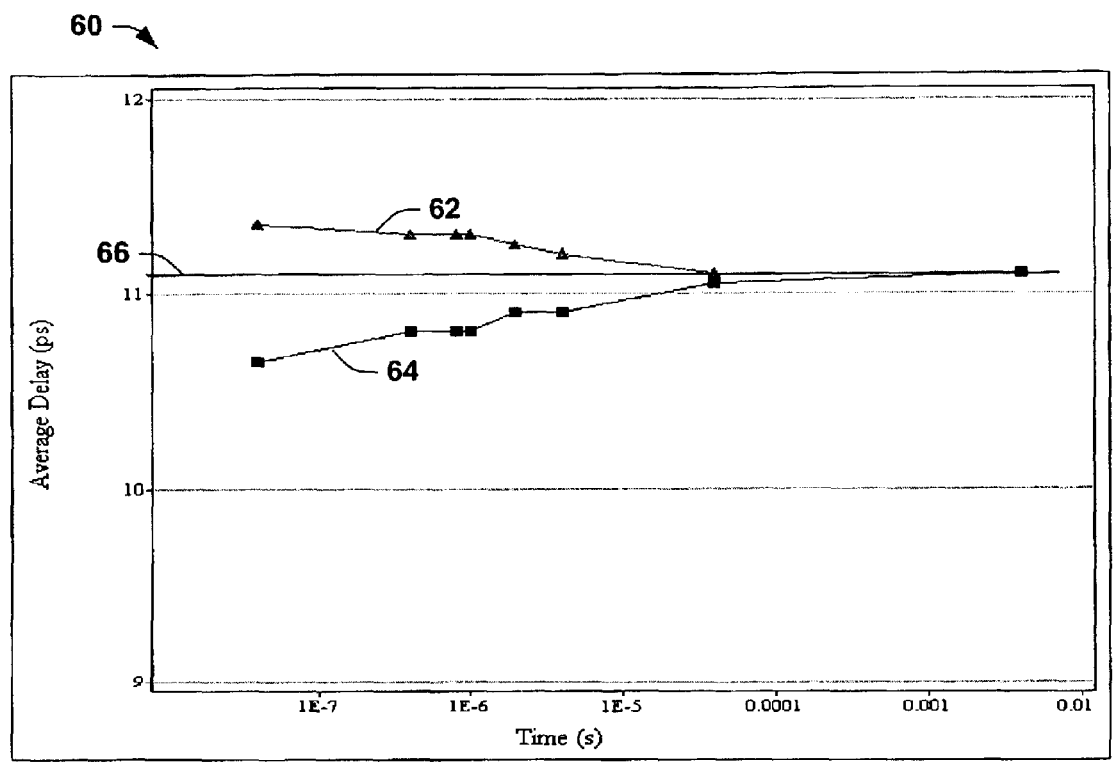
FIG. 2 is a graph illustrating exemplary floating body propagation delay vs. time in SOI floating body transistor devices for pulse edges measured from rising edge to rising edge and from falling edge to falling edge.

Referring also to FIG. 2, these floating body effects are illustrated in a graph 60 having curves 62 and 64 of propagation delay vs. time for pulse edges measured from rising edge to rising edge and from falling edge to falling edge, respectively, starting from the DC HI state. In the above example, the propagation delay times are dependent upon the floating body potential, wherein $t_{pd1}>t_{pd2}$ and $t_{pu1}<t_{pu2}$ in the floating body chain 50. Thus, where an individual inverter device in the chain 50 is initially pulsed after being at a DC steady state for a relatively long period of time (e.g., t is small in the graph 60), the falling edge to falling edge curve 62 is higher than the rising edge to rising edge curve 64. As pulses continue to be applied to the chain, the floating body potential moves less and less (e.g., f increasing in the graph 60), with the curves 62 and 64 coming closer together. Continuing on, an AC steady state condition is reached, wherein the curves 62 and 64 join at an AC steady state delay value 66, whereat $t_{pd1}=t_{pd2}$ and $t_{pu1}=t_{pu2}$, and accordingly, the propagation delay is essentially constant.

Thus, the delay caused by the body potential variation depends on the switching history. However, most circuits do not switch constantly, nor do they typically sit idle for long periods of time. Thus, manufacturing process control of this history effect is important to the design and manufacturing of floating body SOI devices. Absent some measure of control over these variations, the design margin required to protect against this uncertainty may erode some or all of the benefits provided by the SOI technology under nominal operation. Accordingly, it is desired to measure the floating body propagation delay of a particular wafer, in order to provide assurance of design veracity, as well as of manufacturing process stability.

Figure 3:
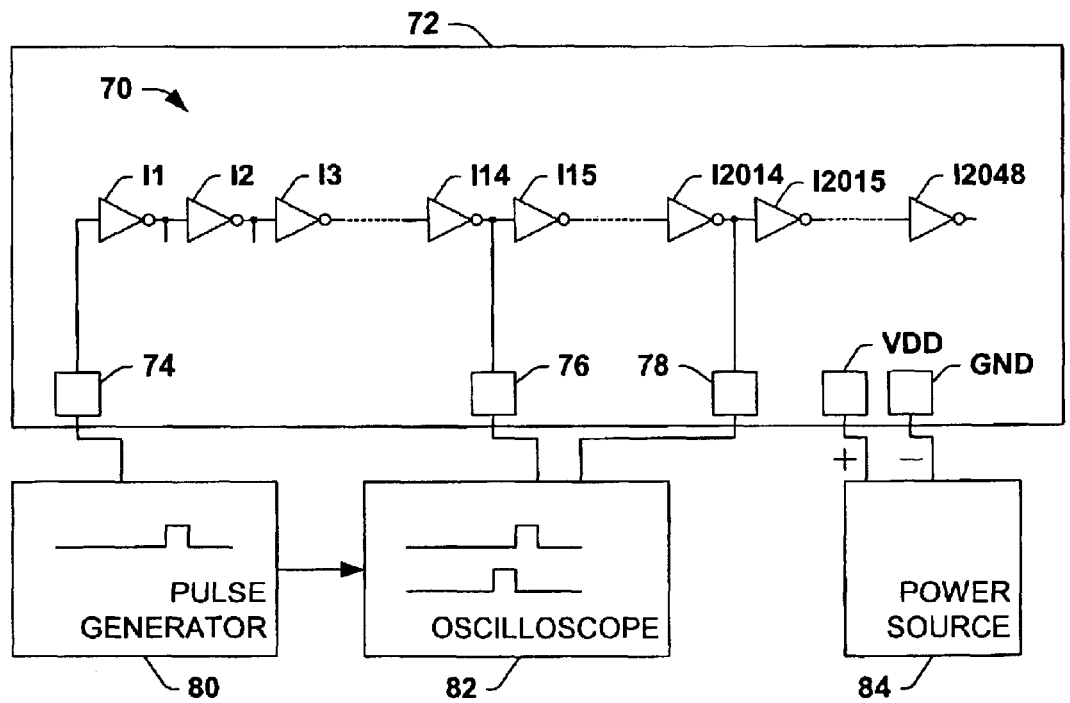
FIG. 3 is a schematic diagram illustrating a conventional test system for measuring SOI floating body delay effects using an external high speed pulse generator and oscilloscope.

Referring to FIG. 3, these effects have previously been measured using a chain 70 of floating body inverter devices I1, I2, I3, . . . , I2048 formed in an SOI wafer 72, with probe pads 74, 76, and 78 for connecting a pulse generator 80 and an oscilloscope 82, respectively, to the wafer 72. Additional VDD and GND pads are provided for connection of an external power source 84 to power the devices I1-I128 and to the buffers, wherein the pulse generator 80, the oscilloscope 82, and the power source 84 constitute a test system 78. The test system 78 is operated manually on a test bench (not shown), to monitor floating body transistor switching delays under various conditions. The pulse generator 80 is connected to the input pad 72 at the input of the first inverter device I1 and to the oscilloscope 82, and one or more inverter device outputs are monitored, such as the outputs of inverters I14 and I2014 in the illustrated example, by connection of high frequency oscilloscope probes to the pads 74 and 76, respectively. However, this form of testing is time consuming, requiring an operator to manually locate trace edges of interest using the oscilloscope, and is not suited to automation. Moreover, the system 78 and the prior floating body effect measurement techniques require the use of high-resolution equipment and high speed probe cards, wherein the test structure requires a relatively long chain and the testing throughput is relatively low. In addition, accurate edge placement control in a standard wafer tester is extremely difficult for the setup of FIG. 3.

Referring now to FIGS. 4–9, the present invention provides test systems and apparatus for measuring hysteretic propagation delay and for otherwise characterizing floating body effects in SOI wafers, which apparatus may be automated using commercially available test equipment. In this regard, the present invention may be implemented to facilitate testing of a short delay chain or other test circuitry, and may be carried out using commercially available test equipment and probe cards therefor. Moreover, the systems and apparatus of FIGS. 4–9, and other apparatus may be employed in practicing one or more methods of the present invention, as described further below with respect to FIG. 11.

Figure 4:
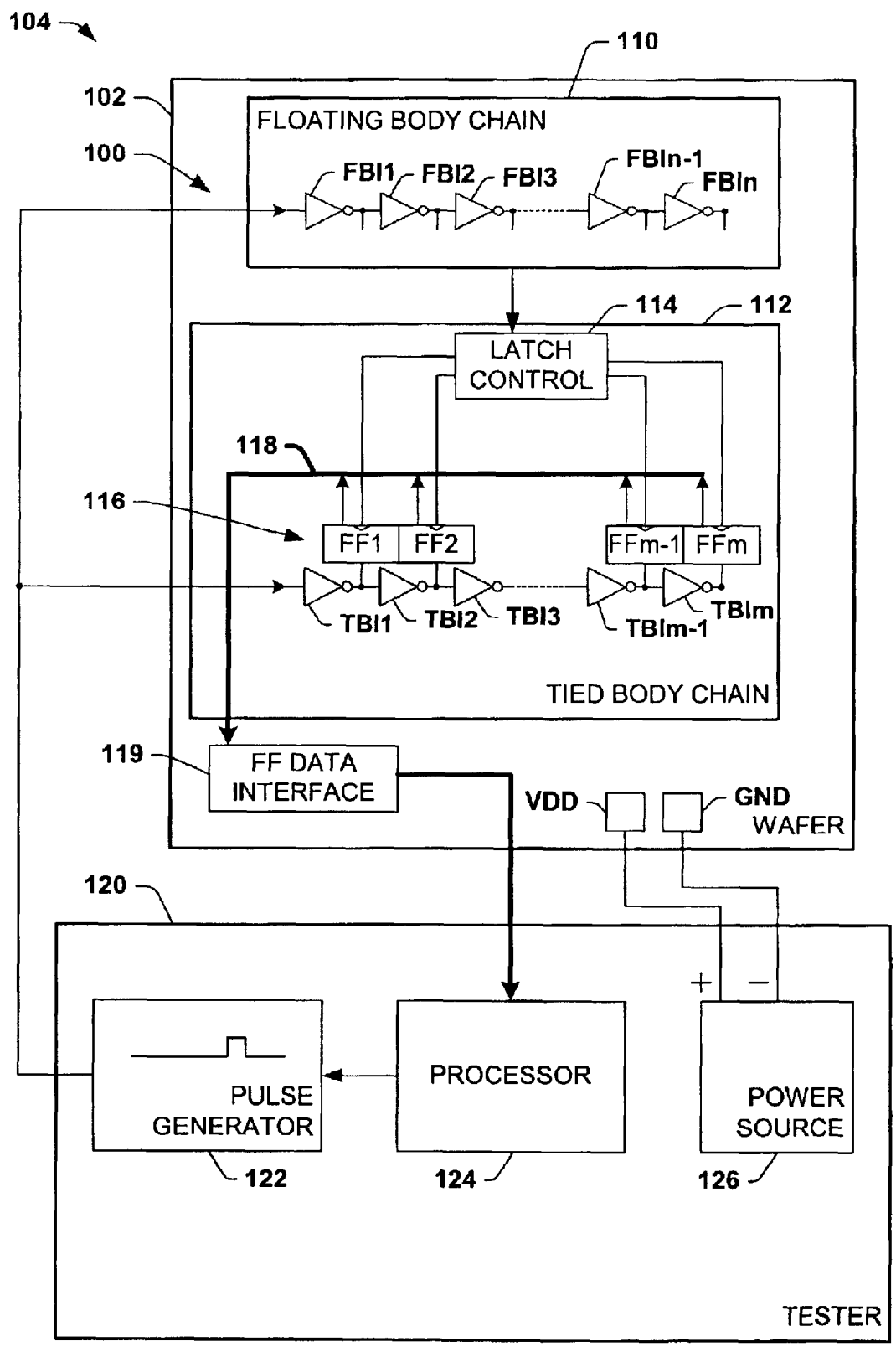
FIG. 4 is a schematic diagram illustrating an exemplary test system and test apparatus thereof for characterizing floating body delay effects in an SOI wafer in accordance with one or more aspects of the present invention.

FIG. 4 illustrates one exemplary implementation of a test apparatus 100 formed in an SOI wafer 102, and a test system 104 for characterizing floating body effects in the wafer 102 in accordance with the invention. The apparatus 100 comprises a floating body chain 110 comprising an integer number n of floating body inverter devices FBI1–FBIn, which are connected in series with one another in the wafer 102, wherein the floating body inverter devices FBI individually comprise floating body MOS transistors fabricated in the wafer (e.g., FIGS. 1A–1D above). The test apparatus 100 further comprises a reference delay chain, such as a tied body chain 112 comprising an integer number m of tied body inverter devices TBI1–TBIm fabricated in series with one another in the wafer 102, wherein the tied body inverter devices individually comprise tied body MOS transistors fabricated in the wafer 102.

A plurality of storage elements such as flip-flop type, single input, edge-triggered registers 116 (e.g., flip-flops FF1–FFm in this implementation) are formed in the wafer 102 and individually coupled with the tied body inverters TBI1–TBIm, wherein the inverter outputs are coupled to the flip-flop inputs. The flip-flops 116 operate to store the inverter output data from the tied body devices TBI1-TBIm according to one or more signals from the floating body chain 110 via a clock control 114, wherein the clock control 114 may comprise circuit elements (not shown), or may merely comprise electrical connections from one or more of the floating body inverter outputs to the clock inputs of the flip-flops 116. Thus, the flip-flops 116 are coupled with at least one of the floating body devices FBI1–FBIn, so as to store tied body chain data from the tied body devices TBI1–TBIM according to the floating body devices FBI1–FBIn.

First inverter devices TBI1 and FBI1 in the tied body chain 112 and the floating body chain 110, respectively, are coupleable with a tester 120 to receive a pulse edge or pulse train input from a pulse generator 122 in the tester 120. Stored tied body data may be obtained from the flip-flops 116 via a data bus 118 and a data interface 119 by a processor 124 in the tester 120, for use in characterizing floating body effects in the wafer 102 in accordance with the invention. The data transfer may be performed in any appropriate manner, either parallel or serial, by which the tied body data is made available to the processor 124 for computation of one or more floating body delay values. The tester 120 also provides electrical power to the devices in the wafer 102 using a power source 126 coupled with VDD and GND pads on the wafer 102.

Figure 5:
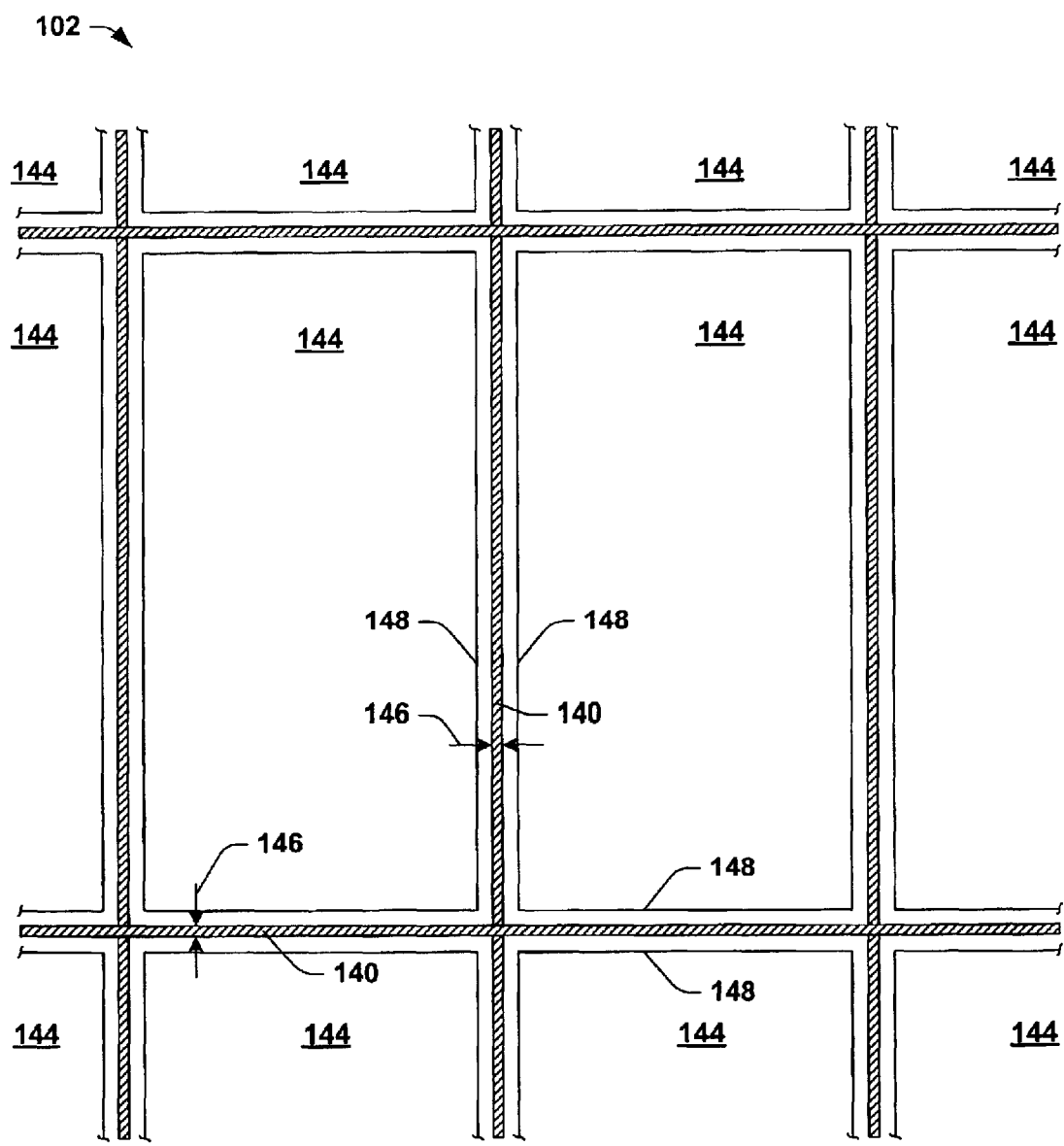
FIG. 5 is a partial top plan view illustrating a portion of a wafer having scribe line regions between adjacent die areas, in which the test circuitry and apparatus of the present invention may be formed.

Referring also to FIG. 5, the exemplary test apparatus 100 is implemented as a scribe line monitor (SLM) formed in scribe line regions 140 of the wafer 102 between adjacent die areas 144 thereof, although the test apparatus 100 and other apparatus in accordance with the present invention may be alternatively fabricated anywhere on the wafer 102. The die areas 144 are generally rectangular regions within the die boundaries 148, wherein individual electrical components and circuits (not shown) are formed in fabricating integrated circuit devices. The scribe line regions 140 are defined between adjacent die areas 144, through which channels are subsequently saw-cut to separate the individual dies 144 from the wafer 102. The scribe line regions 140 commonly have a width 146 sufficient to accommodate the width of saw blades or other separation tools (not shown) and to provide appropriate tool alignment tolerance during subsequent die separation operations. The test apparatus 100 of the present invention may alternatively be formed in the die areas 144. However, it is noted that fabricating the apparatus 100 in the scribe line regions 140 facilitates improved device density and space utilization in the die areas 144, wherein the test apparatus 100 may be employed to characterize the SOI process during the manufacturing process prior to die separation.

Figure 6:
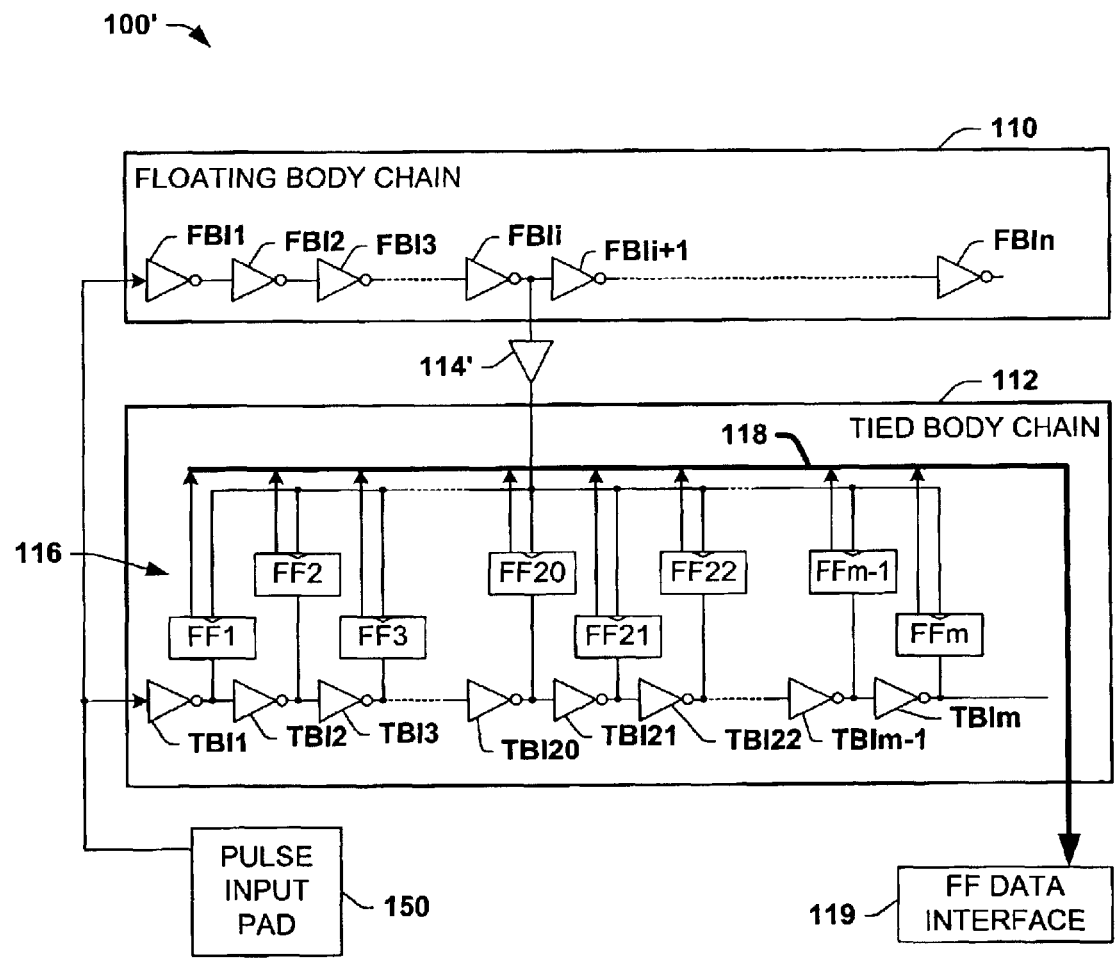
FIG. 6 is a schematic diagram illustrating another exemplary implementation of a test apparatus in accordance with the invention.

Another exemplary implementation of test apparatus 100' is illustrated in FIG. 6, wherein the output of an ith inverter stage FBIi in the floating body chain 110 is buffered using a clock control buffer 114', which is then provided to the tied body chain 112 to clock the flip-flops 116. This latches or stores the tied body device data states from the inverters TBI in the tied body chain 112 according to the output state of the floating body inverter FBIi. In operation, a pulse edge is applied to an input pad 150, which then propagates through the tied body chain 112 and the floating body chain 110. As the pulse edge reaches the floating body inverter FBIi, the output states of the tied body devices TBI are stored by the flip-flops 116.

This stored tied body data is then available to a test system processor or other device through the data bus 118 and the data interface 119. The propagation delay variance in the floating body devices FBI will not be seen in the tied body devices TBI, wherein the delay chain 110 with the floating body devices FBI is used as a vehicle to characterize hysteretic delays in the wafer 102, while the delay chain 112 with the tied body devices TBI is used as a reference. The tied body data from the latches 116 will thus indicate the number of tied body devices TBI to which the pulse edge has propagated, and from this information, the processor may determine a floating body delay value.

Figure 7:
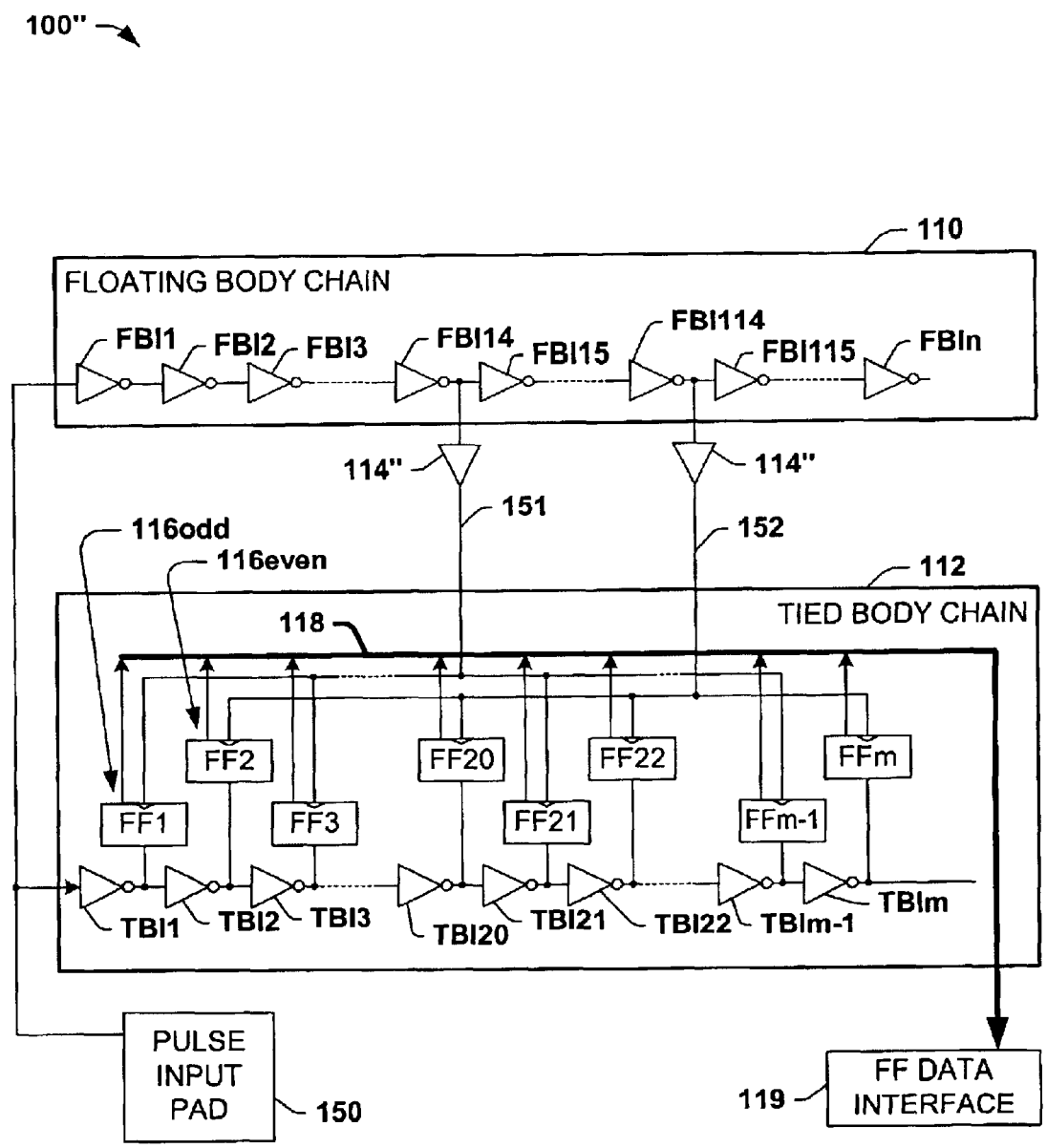
FIG. 7 is a schematic diagram illustrating yet another implementation of a test apparatus in accordance with the invention.

Another possible implementation 100" is illustrated in FIG. 7, wherein the outputs of two floating body inverter devices FBI14 and FBI114 are provided through buffers 114" to first and second sets 116odd and 116even of flip-flops FF. The first set 116odd includes the flip-flops FF1, FF3, . . . , FFm-1. (e.g., FFodd) which are individually coupled with odd numbered tied body inverter devices TBI1, TBI3, . . . TBIm-1, (e.g., TBIodd, wherein m is an even integer) where the odd flip-flops FFodd are adapted to store tied body chain data from the odd numbered tied body inverters TBIodd according to a first control or clock signal 151 indicating the pulse edge has propagated to the floating body inverter FBI14. The second set 116even includes the even numbered flip-flops FF2, . . . , FFm, (e.g., FFeven) which are individually coupled with even numbered tied body inverter devices TBI2, . . . TBIm, (e.g., TBIeven) where the even numbered flip-flops FFeven are adapted to store tied body chain data from the even numbered tied body inverters TBIeven according to a second control or clock signal 152 indicating the pulse edge has propagated to the floating body inverter FBI114.

The stored tied body data from the flip-flops 116 may be segmented into first and second tied body data corresponding to the data latched according to the first and second clock signals. Thus, the first tied body data is indicative of the number of tied body devices TBI to which the pulse edge has propagated at the time when the pulse edge propagates through the floating body chain 110 to the 14th inverter FBI14. Similarly, the second tied body data is indicative of the number of tied body devices TBI to which the pulse edge has propagated at the time when the pulse edge propagates through the floating body chain 110 to the 114th inverter FBI114. In operation, a single pulse edge may thus be applied to the pad 150, which then propagates through the tied body and floating body chains 112 and 110, respectively, with the (first) data from the odd numbered inverters being stored according to the control signal 151 when the pulse edge reaches the floating body inverter FBI14, and the (second) data from the even numbered inverters being stored according to the second control signal 152 when the pulse edge reaches the floating body inverter FBI114.

Thereafter, the first and second data is read out from the flip-flops 116odd and 116even, respectively, through the interface 119. These data values can be used to determine first and second delay values, spaced by the number of floating body chain devices between the inverters FBI14 and FBI114 (e.g., 100 in this example), by which a determination may be made (e.g., in a test system processor or by other appropriate means) of a floating body propagation value in accordance with the present invention. It is noted in this regard, that the data is obtained without the need for expensive oscilloscopes, as was the case with prior test systems (e.g., FIG. 3 above), and that the provision of the pulse edge and the reading of the latch data may be done using low speed, inexpensive testers and probe cards therefor. Thus, the present invention provides significant advantages in testing large numbers of SOI wafers in a short period of time, whereby the invention finds particular utility in production testing applications.

Figure 8A:
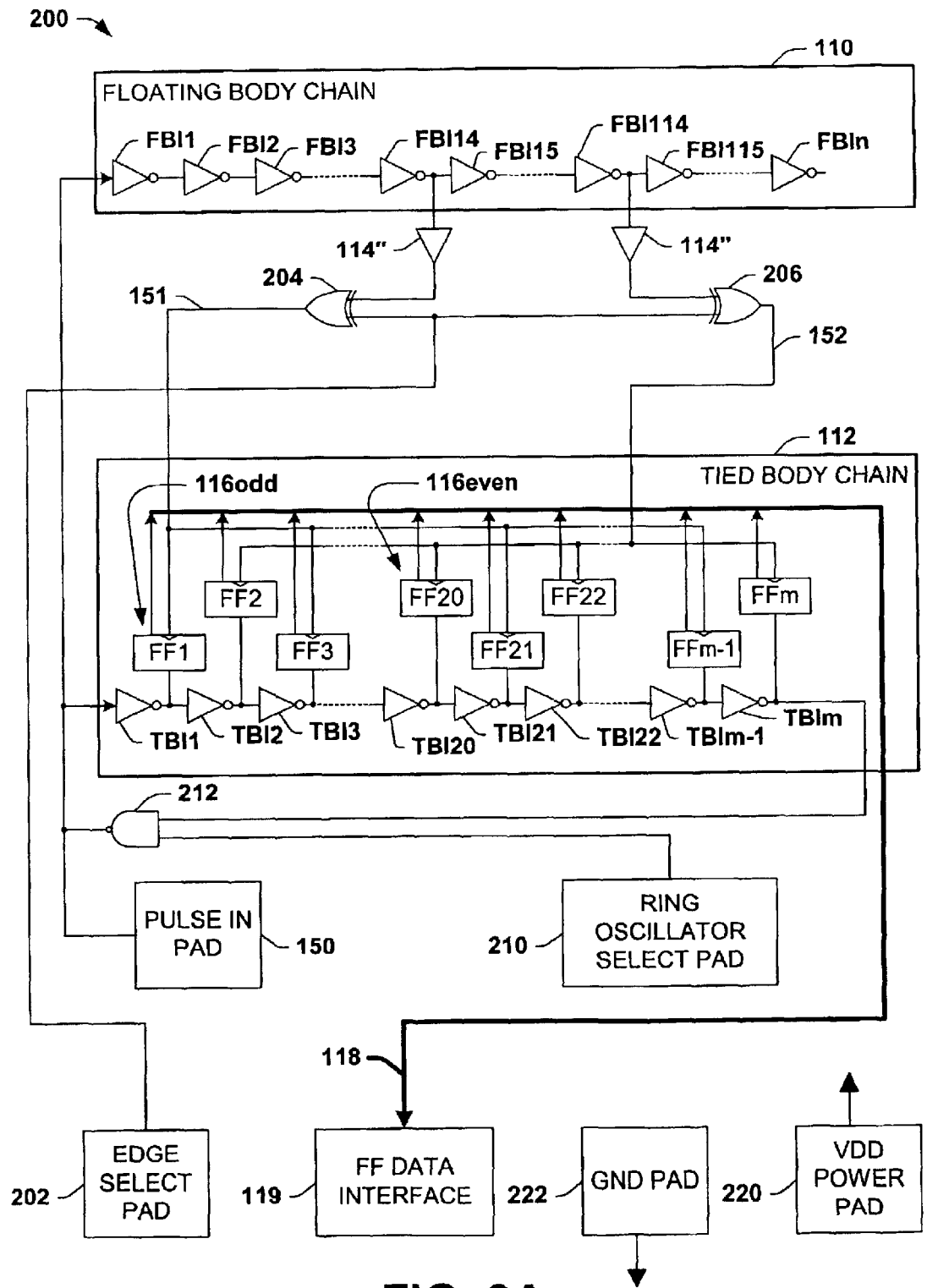
FIG. 8A is a schematic diagram illustrating still another exemplary implementation of a test apparatus in accordance with the invention.

Another example of the invention is illustrated as a test apparatus 200 of FIG. 8A. In this example, an edge select pad 202 and exclusive OR (XOR) gates 204 and 206 provide control over whether the first and second control or clock signals 151 and 152 are indicative of rising-to-rising edge delay or falling-to-falling edge delay. In addition, a ring oscillator select pad 210 and a NAND gate 212 provide the capability of selectively connecting the first and last inverters TBI1 and TBIm together, by which the tied body chain 112 can be turned into a ring oscillator by application of a ring oscillator control signal (RO) to the pad 210. Also illustrated in the apparatus 200 are a VDD power pad 220 and a GND pad 222 for application of power to the apparatus 200 in the wafer using an external test system power source. In other respects, the apparatus 200 operates in similar fashion to the test apparatus 100" of FIG. 7.

In operation, the beginning and end of the reference tied body chain 112 are connected according to the control signal RO at the pad 210, by which the delay per tied body stage may be measured. In this regard, it is noted that an odd number of tied body inverter devices TBIm are provided in the chain 112 (e.g., m is an even integer), wherein an even number m inverters are in the chain 112 and the NAND gate 212 adds a further inversion, such that connection of the output of TBIm to the input of TBI1 through the inverting NAND gate 212 creates an oscillator in the chain 112. In this example, the ring will oscillate at a period of about $n(t_{pd}+t_{pu})/2$, wherein $t_{pd}$ is approximately equal to $t_{pu}$. The period of the oscillation in the chain 112 may be measured by a test system, for example, at the pulse input pad 150, and provided to a frequency divider to ascertain the period, and hence to determine the delay time of the devices TBI absent floating body effects. This information may then be correlated with the delay values obtained above (e.g., correlated with the stored tied body data from the flip-flops 116), to determine a floating body delay value associated with the devices FBI in the floating body chain 110. In alternative implementations (e.g., FIG. 9 below), a ring oscillator circuit may be included in the test apparatus on the wafer, wherein the ring oscillator circuit comprises a frequency divider receiving an output of one of the tied body devices in the tied body chain as well as a buffer receiving a divided count of transitions on the output of the tied body device from the frequency divider.

In one example of the operation of the apparatus 200, a single LO-HI switch 00001111 is applied to the input pad 150 with the edge select signal at the pad 202 LO. Initially, the output of the odd numbered tied body inverters TBIodd is 1, and the even numbered inverters TBIeven are at 0. The rising edges 01 start propagating through the floating body and tied body chains 110 and 112 at about the same time with an offset due to different propagation paths. When the rising edge reaches the floating body device FBI14, a positive edge travels through the associated buffer 114" and serves as a clock signal 151 to load the data of the TBIodd devices into the flip-flops 116odd. Because of possible setup and hold time violations, the pattern of the odd numbered flip-flops 116odd may be 11 . . . 1111×00 . . . 000, where x is at the jth stage of the tied body chain 112. The total delay is in the range of (j−1)$t_t$ to (j+1)$t_t$ where $t_t$ is the delay per stage of the tied body chain 112, assuming the rising and falling delays are about the same by choosing a proper Wp/Wn ratio. In this case, the measurement accuracy is between 1.0 and 2.0 times $t_t$. This delay time can be described by equation (1) below:

$$j't_t \approx t_{fl4} + t_{buf1} + \delta, \quad (1)$$

where $t_{fl4}$ is the time for the rising edge to travel from the input to the $14^{th}$ stage of the floating body chain 110, $t_{buf1}$ is the time from the $14^{th}$ floating body gate FBI14 to the latches 116, and $\square$ is the skew between the rising edges at the floating-body and tied-body chain inputs at FBI1 and TBI1, respectively.

Likewise, when the rising edge reaches the $114^{th}$ FB stage at inverter FBI114, the pattern of the even numbered latches 116even would be 00 . . . 00×1111 . . . 11, where x is the k-th stage of the tied body chain 112. In this case:

$$k't_t \approx t_{fl14} + t_{buf2} + \delta. \quad (2)$$

Assuming $t_{buf1} = t_{buf2}$, the delay per stage of the floating body chain 110 may be approximated by the following equation (3):

$$\text{delay} \approx (t_{fl14} - t_{fl4})/(114-14)$$

$$\approx ((k-j)t_t + (t_{buf1} - t_{bu2}))/100 \quad (3)$$

$$\approx (k-j)t_t/100,$$

wherein the accuracy is about $2t_t$ to $4t_t$. The above also holds true for the case of a single HI-LO pulse edge input switch at pad 150 where the edge select signal at pad 202 is 1.

To illustrate the accuracy potential of the apparatus 200, it is assumed in the above example that the input pad 150 is initially LO, and that a LO-HI transition pulse edge is provided at the pulse input pad 150, wherein the delay per stage is 15 ps for the floating body inverters FBI and 40 ps for the tied body inverters TBI. For δ=0 and $t_{buf1} = t_{buf2} = 120$ ps, it will take 15 ps×14 stages=210 ps for the rising edge to reach the $14^{th}$ stage at FBI14, plus 120 ps (e.g., $t_{buf1}$) to propagate to the load or clock pins of the odd-numbered latches 116odd. As an example, it is assumed that the pulse edge has propagated between the 8th and 9th tied body devices in the chain 112 at this point. Thus, after 210 ps+120 ps=330 ps, the rising edge arrives between the 8th and 9th stages of the TB chain 112 (330 ps/40 =8.25 ps).

Figure 8B:
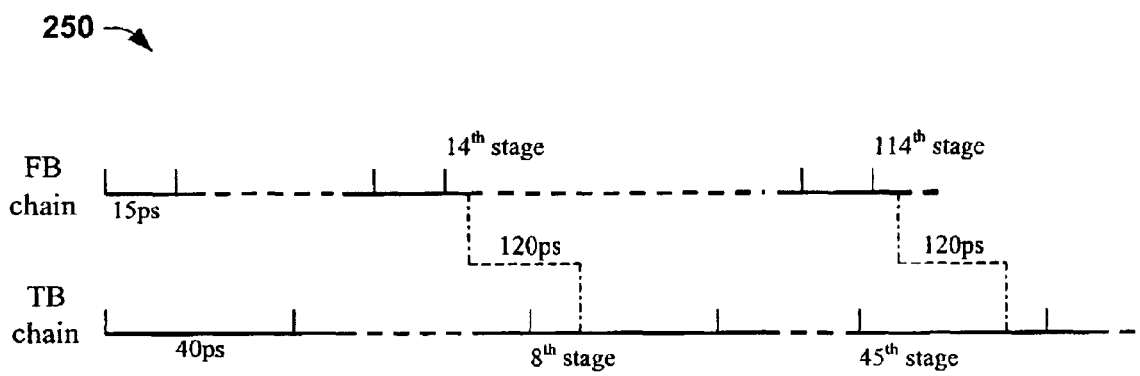
FIG. 8B is a timing diagram illustrating one example of the operation of the test apparatus of FIG. 8A.

The data latched to the odd numbered flip-flops 116odd will accordingly comprise a pattern shown in a graph 250 of FIG. 8B. Also shown is the pattern of the data latched to the even numbered flip-flops 116even after 15 ps×114+120 ps=1830 ps, for a case in which the pulse edge has propagated to the 45th tied body device as it also propagates to the 114th floating body device FBI114. In this example, the 0 to 1 pattern changes at the $45^{th}$ stage after about 1830 ps/40= 45.75 ps. By comparing the two patterns (e.g., the first and second latched tied body data), it is seen in this example that it takes about (45−8)×40 ps=1480 ps for the rising edge to travel between the $14^{th}$ and $114^{th}$ floating body stages. Thus, the calculated floating body propagation delay value in terms of delay per stage is about 1480 ps/100=14.8 ps for the floating body inverters, where the error is about 1%~2% for the measured 14.8 ps as compared to the assumed value of 15 ps.

Preconditioning pulses may also be applied before the measurement as described above. Thus, where a finite number of preconditioning pulses is applied to precondition the body potential, the delay of the tied body stage $t_t$, is essentially the same owing to the lack of the floating-body effects. However, $t_{fl4}$ and $t_{fl14}$ will be different because of the hysteretic floating body effects. Therefore, the number of stages j and k may be different than in the above example, depending on the number of the pre-conditioning pulses and the initial DC HI or LO state if the number of pulses is small. For example, suppose a number of pre-conditioning pulses have been applied, such that the delay per stage reduces to 12 ps for the floating body devices FBI but remains essentially the same for the tied body devices TBI. It is assumed for the sake of illustration that the 1 to 0 pattern change in the odd numbered latches 116odd takes place at the $6^{th}$ stage of the tied body chain 112 when the odd data is stored, although the actual transition occurs at the $7^{th}$ stage ((12 ps×14+120)/40=7.2). In addition, the 0 to 1 pattern changes at the $37^{th}$ stage of the chain 112 ((12 ps×114+120 ps)/40= 37.2 ps). For this example, then, the calculated delay per stage is (37−6)×40 ps/100=12.4 ps. The error is about 3%~4% for the measured 12.4 ps as compared to the actual 12 ps.

Decreasing the delay per stage of the tied body inverter devices TBI may be done to increase the resolution of these measurements. In one example, this can be accomplished by applying a higher supply voltage to the tied body chain 112. Alternatively or in combination, the number of the floating body and tied body stages can be increased to improve the floating body delay value measurement for a given resolution. For instance, if the number of stages increases from 100 to 200, the error can be reduced by 50%. While this approach increases the area utilization of the SMT test apparatus, the employment of scribe line region space for the test apparatus (e.g., FIG. 5) may allow such increases in the number of stages without adversely impacting the die regions, where improved measurement accuracy is desired.

Figure 9:
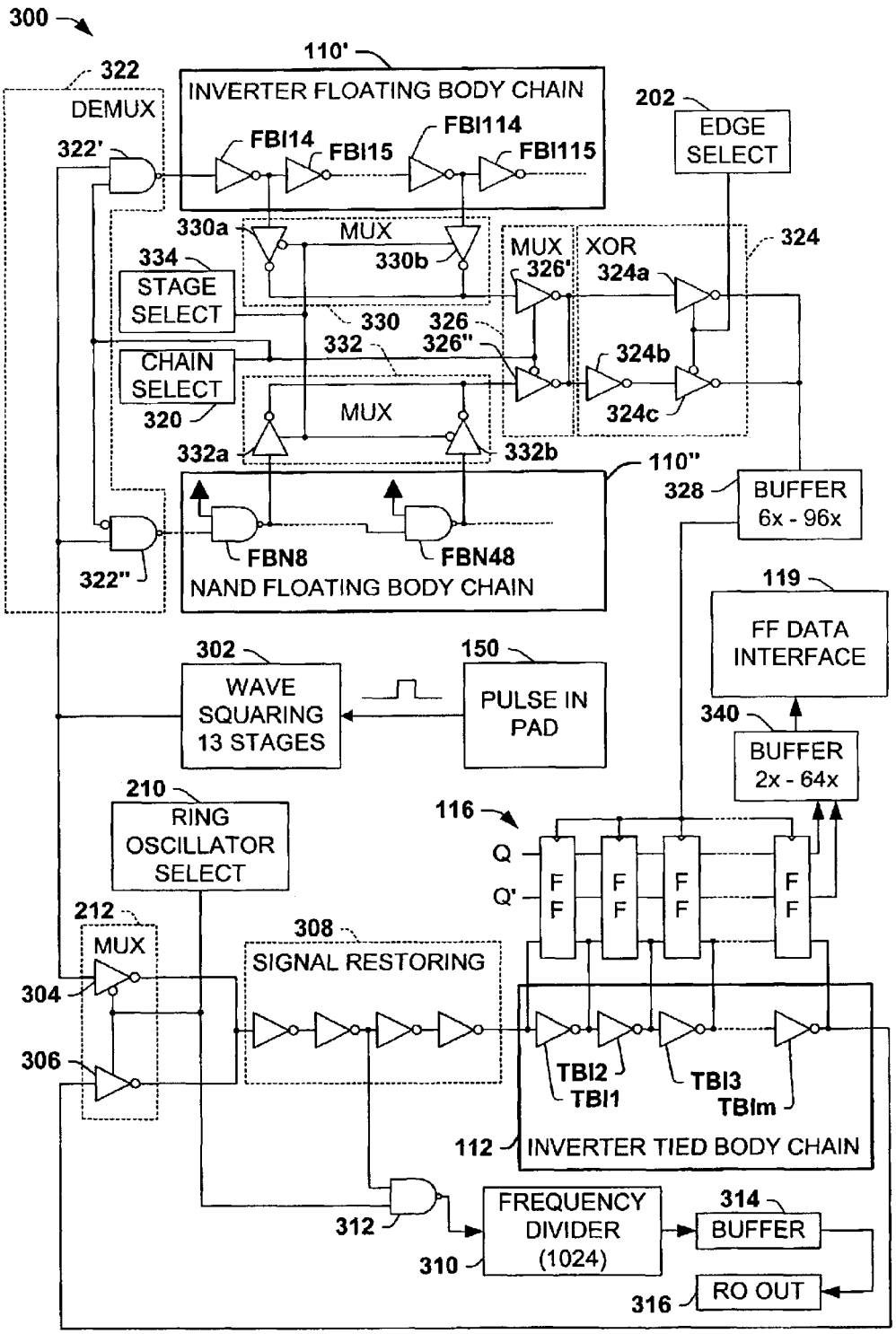
FIG. 9 is a schematic diagram illustrating another exemplary implementation of a test apparatus in accordance with the invention.

Referring now to FIG. 9, still another possible implementation is illustrated of a test apparatus 300 in accordance with the present invention. The test apparatus 300, like the apparatus 100, 100', 100", and 200 above, may be fabricated in the scribe line region 140 of the wafer 102 (e.g., FIG. 5), wherein appropriate connection pads are provided for accessing the pulse input, control signal, and data output connections by a test system, as described below. In this apparatus 300, a ring oscillator circuit is also provided, comprising a 2-by-1 mux 212 to selectively provide a pulse edge or edges from a pulse input pad 150 through a 13 stage wave squaring circuit 302 to the tied body inverter chain 112, or to alternatively couple the last tied body inverter output TBIm to the first tied body inverter input TBI1 via tri-state inverter gates 304 and 306, respectively, according to a ring oscillator select signal at the pad 210. Whereas input signals driving a large pad capacitance tend to have slower rising and falling time (slew rate), the wave squaring circuit 302 is employed in this example to restore the square waveform, and may comprise Schmitt triggers or cascaded inverters, although any appropriate circuitry may be employed.

One or more signal restoring gates 308 are optionally provided upstream of the inverter tied body chain 112, and one of the signal restoring inverter outputs is selectively provided to a frequency divider 310 (e.g., divide by 1024 in this example) via a NAND gate 312 according to the signal at the ring oscillator select pad 210. For example, where separate power supplies are used during testing to power the floating body chains 110 and the tied body chain 112, a pulse input signal may be weak if the power supply voltage of the floating body chain is lower than that of the tied body chain. In this regard, the signal restoring gates 308 operate to restore the signal strength. A divided signal is then provided from the frequency divider 310 to a buffer 314, wherein the buffered frequency data is made available to a test system via a ring oscillator output interface 316.

The apparatus 300 also comprises two floating body chains 110' and 110", comprising floating body inverter devices FBI1–FBI115 and floating body NAND gate devices FBN1–FBN48, respectively. A chain select signal is provided at a chain select pad 320 by an external tester (not shown) to a 1-by-2 demux 322 comprising 2-input NAND gates 322' and 322" to selectively provide the pulse input edge or edges to one of the floating body chains 110' or 110" via gates 322' and 322", respectively. The chain select signal from pad 320 also provides a select signal to a 2-by-1 mux 326 comprising tri-state inverters 326' and 326" to selectively provide the pulse output edge or edges from one of the floating body chains 110' and 110" via gates 326' and 326", respectively. The selected pulse output edge or edges from mux 326 are then applied to one input of a 2-input exclusive OR (XOR) gate 324 comprising tri-state inverters 324a, 324b and 324c. An edge select signal from an edge select pad 202 is applied to the other input of the XOR gate 324 to select whether the clock signal from the floating body chain indicates rising to rising edge delay or falling to falling edge delay measurements. The XORed signal is further applied to a buffer 328 for providing a control or clock signal or signals to store the tied body data into differential logic, level sensitive latches 116.

As with the above test apparatus, the floating body inverter chain 110' is tapped at the 14th and 114th stages via a 2-by-1 mux 330 comprising tri-state inverters 330a and 330b, respectively, whereas the floating body NAND gate stage 110" is tapped at the 8th and 48th stages via a 2-by-1 mux 332 comprising inverters 332a and 332b, respectively in this exemplary implementation. A test signal may be applied to a stage select pad 334 to select which stage tap of the selected floating body chain will provide the control signal to the buffer 328, wherein the flip-flops 116 all store tied body chain data according to a single event from the buffer 328. For example, the stage select signal selects which stage to be measured, wherein a "1" selects the 14th stage of the inverter chain 110' and the 8th stage of the NAND chain 110", and a "0" selects the 114th stage of the inverter chain 110' and the 48th stage of the NAND chain 110". The stored tied body data is then provided to the data interface 119 via a data buffer 340.

The apparatus 300 may be operated to determine floating body effects in one or both of the chains 110' or 110", wherein the period of the oscillation in the tied body chain 112 may be measured, either before or after obtaining data from the latches 116, using the ring oscillator circuit, whereby the period of tied body device oscillation is obtained by the tester via the frequency divider 310, the buffer 314, and the interface 316, with an appropriate select signal applied at the ring oscillator select pad 210. The ring oscillator is then deactivated using the pad 210, and a pulse edge may then be applied to the pad 150 and data is stored in the latches 116.

Unlike the stored tied body data of the apparatus 200, the data in FIG. 9 comprises both odd and even data, whereas a pattern of alternating "1" and "0" values will be interrupted at the point where the applied pulse edge has propagated when the latch control signal occurs. For example, the latched tied body data will comprises alternating "1" and "0" values, with one occurrence of a pair of consecutive "1" values or two consecutive "0" values, at the point to which the pulse edge has propagated. As in FIG. 8A above, this information may then be correlated with the stored tied body data from the latches 116, to determine a floating body delay value associated with the floating body devices in one or both of the floating body chains 110' and/or 110".

For sake of discussion, it is assumed that the floating body inverter chain 110' is selected via the chain select pad 320. Also, a signal is provided to the edge select pad 202 to select whether the latch control signal from the floating body chain 110' indicates rising-to-rising edge delay or falling-to-falling edge delay. In addition, one of the stage taps (14th or 114th) is selected using the stage select pad 334, wherein the external tester applies appropriate control signals to the various selection pads discussed herein. For example, the 14th stage of the floating body inverter chain 110' is initially selected, and a pulse edge is applied to the pulse input pad 150 (e.g., by a pulse generator in the tester, not shown).

As the pulse edge propagates through the tied body chain 112 and the selected floating body inverter chain 110', the mux 330, the mux 326, the XOR circuit 324, and the buffer 328, provide a latch signal to the latches 116 when the pulse edge reaches the output of the 14th floating body inverter FBI14, causing the tied body chain data to be stored. This data may then be clocked out of the latches 116 and into the buffer 340 for later or contemporaneous retrieval by the tester.

The stage select signal at the pad 334 is then switched, to now employ the tap at the 114th stage of the floating body inverter chain 110' as the control signal. Another pulse edge is then provided to the input pad 150, and the process is repeated. However, in this case, the control signal is provided through the tri-state inverter 330b to the mux 326, the XOR circuit 324, and the buffer 328, whereupon the tied body data is stored when the pulse edge reaches the output of the 114th floating body inverter FBI114. This stored data is then provided to the buffer 340. These data sets may be evaluated and compared to determine a number of tied body inverter delays corresponding to 100 floating body inverter delays, which is then correlated to the tied body inverted delay obtained from the ring oscillator operation, in order to ascertain an estimate of the floating body delay value of interest.

Figure 10A:
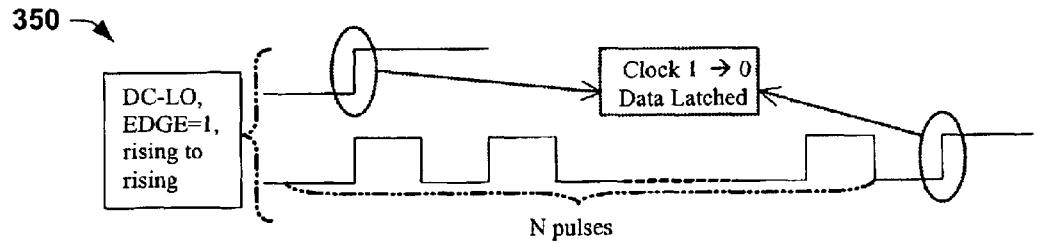
FIGS. 10A–10D are graphs illustrating waveforms for hi-lo and lo-hi pulse edges measured from rising edge to rising edge, and from falling edge to falling edge.
Figure 10B:
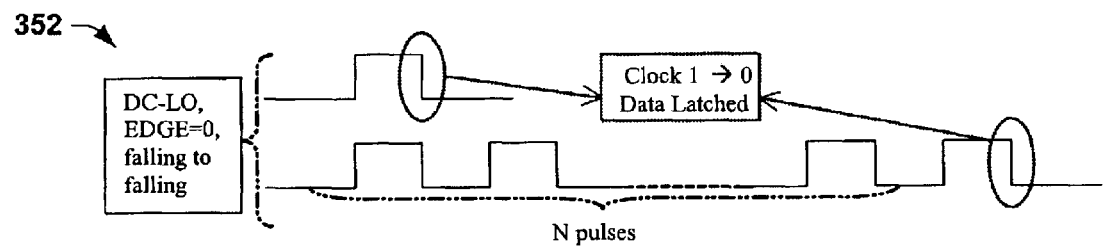
Figure 10C:
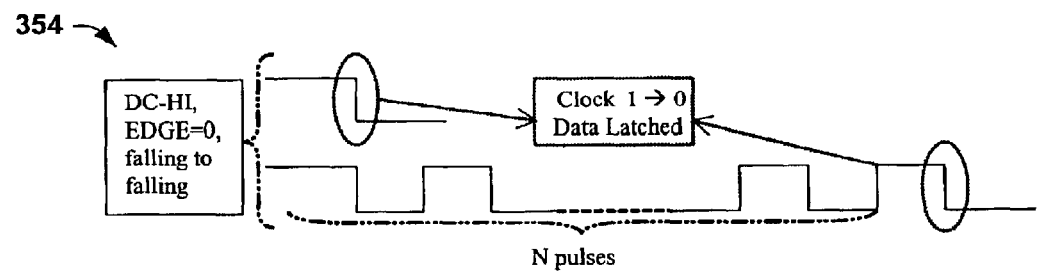
Figure 10D:
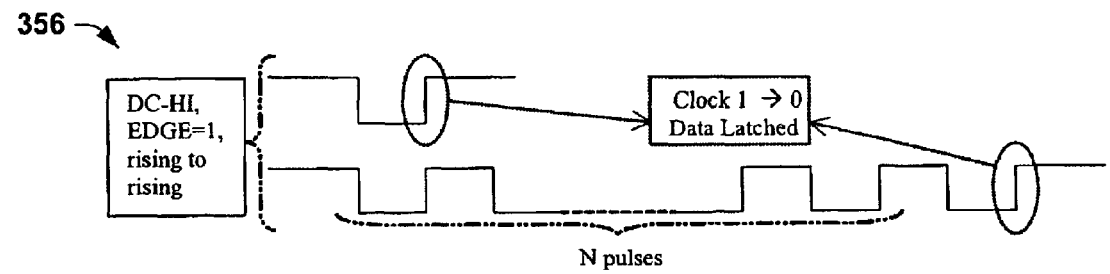

It will be appreciated that any number of such single-pass or dual-pass tests may be performed with varying numbers or types of preconditioning pulses, so as to generate a curve, such as those illustrated above in FIG. 2. Referring to FIGS. 10A–10D, in any of the above tests, the edge select pad 202 and the exclusive OR circuit 324 allow data to be obtained for both rising-to-rising edge delays or falling-to-falling edge delays. For example, where the storage devices 116 are negative level sensitive latches, the tied body data prior to the falling edge of the last clock pulse are latched into the latches 116. FIG. 10A illustrates the waveforms 350 for a rising edge to rising edge measurement, where the floating body chain is initially held at a LO DC steady state (e.g., 0V) prior to application of a rising pulse edge with or without preconditioning pulses. FIG. 10B illustrates a diagram 352 showing the waveforms for a falling edge to falling edge measurement, where the floating body chain is initially held at a LO DC steady state prior to application of a falling pulse edge with or without pre-conditioning pulses. FIG. 10C illustrates the waveform in a diagram 354 for a falling edge to falling edge measurement, where the floating body chain is initially held at a HI DC steady state (e.g., 1.5V) prior to application of a falling pulse edge with or without pre-conditioning pulses, and FIG. 10D provides a diagram 356 illustrating the waveforms for a rising edge to rising edge measurement, where the floating body chain is initially held at a HI DC steady state prior to application of a rising pulse edge with or without preconditioning pulses. The plot 60 of FIG. 2 illustrates a bench measurement result for a long delay chain with a fan-out of 1 and the initial state at HI, using 250M Hz frequency and 50% duty cycle, i.e. 40 ns period and 20 ns pulse width. The upper curve 62 in this example shows a first switch delay (falling edge to falling edge delay) and the lower curve 64 shows a second switch delay (rising edge to rising edge delay). To get a data point for the falling edge to falling edge delay at time=0, the waveform of FIG. 10C (40 ns period and 20 ns pulse width) can be applied without preconditioning pulses and by selecting the inverter floating body chain and the $14^{th}$ stage and setting EDGE=0. The process repeats for the $114^{th}$ stage, and a propagation delay can be obtained by comparing the two data patterns. Similarly, to get a data point for the rising edge to rising edge delay at time=1 us, the waveform of FIG. 10D can be applied with 25 pre-conditioning pulses (1 us/40 ns=25). From these measurements, therefore, the propriety and stability of an SOI design and/or an SOI manufacturing process may be measured in accordance with the invention. Furthermore, it is noted that the test system required to operate the apparatus 300 and the other implementations of the invention, may be easily automated, whereby expeditious testing of a large number of wafers may be performed in a relatively short period of time. Thus, the invention is particularly advantageous in testing production wafers in a manufacturing facility prior to die separation.

Alternatively or in combination, further tests may be performed in the apparatus 300, wherein the NAND floating body device chain 110" is selected via the chain select pad 320. For example, the first stage tap at the 8th NAND device FBM8 may initially be selected via a signal applied to the stage select pad 334, and a pulse edge is applied to the pulse input pad 150 (e.g., with or without preconditioning pulses). As the pulse edge propagates through the tied body chain 112 and the floating body NAND gate chain 110", the gate 332a, the mux 326, the XOR circuit 324, and the buffer 328, provide a control signal to the latches 116 when the pulse edge reaches the output of the 8th floating body NAND gate FBN8, causing the tied body chain data to be stored. This data is then provided from the latches 116 to the buffer 340.

Thereafter, the stage select signal at pad 334 is again switched, to select the tap at the 48th stage of the floating body NAND gate chain 110" for latch signal generation. Another pulse edge is then provided to the input pad 150, and the process is repeated, wherein a latch signal is provided through the tri-state inverter 332b to the mux 326, the XOR circuit 324, and the buffer 328, whereupon the tied body data is latched when the pulse edge reaches the output of the 48th NAND gate FBN48. This latched data is then provided to the buffer 340. These data sets may be evaluated and compared to determine a number of tied body inverter delays corresponding to 40 floating body NAND gate delays, which is then correlated to the tied body inverted delay obtained from the ring oscillator operation, in order to ascertain an estimate of the floating body delay value of interest. Further passes may be performed using one or more preconditioning pulses, whereby a curve of delay vs. time may be plotted for the floating body NAND gate delays (e.g. FIG. 2).

It will be appreciated that many forms of test apparatus fall within the scope of the present invention and the appended claims, including and in addition to those specifically illustrated and described herein. For example, the exemplary test apparatus 300 of FIG. 9 may be modified within the scope of the invention to provide two sets of storage devices 116 (e.g., such as in FIGS. 7 and 8A), wherein one set operates to store odd numbered tied body device data, and a second set stored even numbered tied body device data. Moreover, any appropriate type of storage device 116 may be employed, including but not limited to edge-sensitive latch circuits, differential latch devices, registers, flip-flops, and others, within the scope of the present invention.

Figure 11:
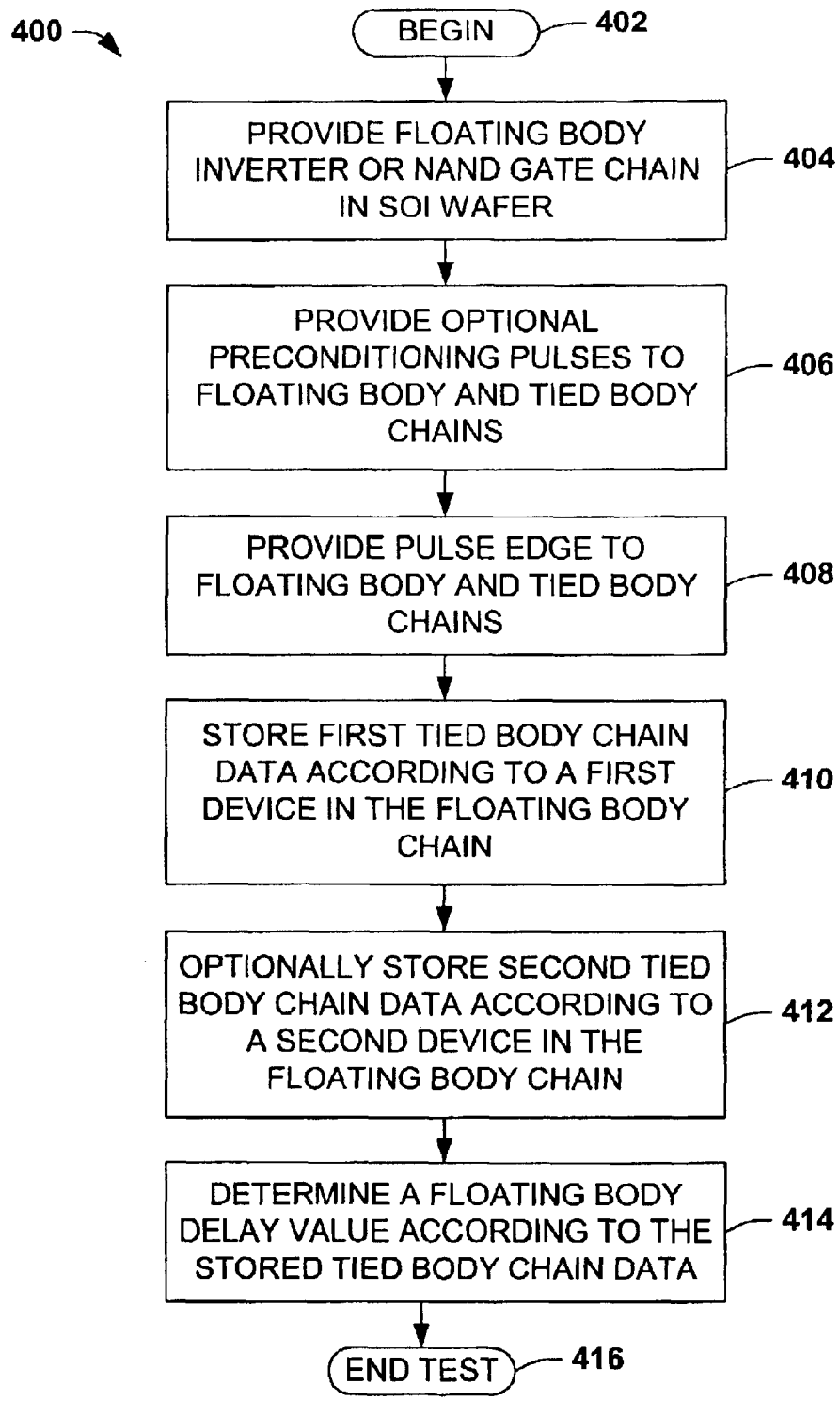
FIG. 11 is a flow diagram illustrating an exemplary method of determining a floating body delay value in accordance with one or more aspects of the invention.

Referring now to FIG. 11, another aspect of the invention provides methods for characterizing floating body delay effects in an SOI wafer, wherein one exemplary method 400 is illustrated and described below. Although the method 400 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the apparatus and systems illustrated and described herein as well as in association with other apparatus or systems not illustrated.

Beginning at 402, the method 400 comprises providing a floating body inverter or NAND gate chain in an SOI wafer at 404, and optionally providing one or more preconditioning pulses to the floating and tied body chains at 406. At 408, a pulse edge is provided to the floating body chain and to the tied body chain, and first tied body chain data is latched at 410 according to a first device in the floating body chain. A second set of tied body data is then optionally latched at 412, according to a second floating body device, and a floating body delay value is determined at 414 to characterize floating body delay effects in the SOI wafer according to the latched tied body data at 414, before the method 400 ends at 416.

In one example, storing the first tied body chain data at 410 comprises storing data outputs from the tied body device chain when the pulse edge propagates through the floating body chain to the first floating body device. Storing the second tied body chain data at 412 may comprise storing data states from the tied body devices when the pulse edge propagates through the floating body chain to the second floating body device. As in the above discussion of FIGS. 7–9, for example, the first and second tied body chain data may be latched during propagation of a single pulse edge, or a second pulse edge may be applied for obtaining the second tied body data.

In this regard, the methods of the invention comprise single pass and multi-pass testing. Furthermore, storing the first tied body chain data may comprise storing data states from odd numbered tied body devices in the tied body chain, and storing the second tied body chain data may comprise storing data states from even numbered tied body devices in the tied body chain, for example, as illustrated and described above with respect to FIGS. 7 and 8A. Moreover, the first data may alternatively be latched from odd numbered tied body devices, with the second data being latched from odd numbered tied body devices. In another alternative, all tied body device data (e.g., odd and even) may be latched at two different times (e.g., according to latch signals from first and second floating body chain devices) in either a single pass test or in a dual pass test. In addition, it is noted that the testing may be carried out with the pulse edge being applied following stabilization of the floating body chain and the tied body chain at a DC state, or alternatively, after provision of one or more preconditioning pulse to the floating body chain and to the tied body chain.

The determination of the floating body delay value at 414 may comprise determining a first value representing a number of tied body devices in the tied body chain to which the pulse edge has propagated in the first tied body chain data, determining a second value representing a number of tied body devices in the tied body chain to which the pulse edge has propagated in the second tied body chain data, and determining the floating body delay value according to the first and second values. In one implementation, moreover, a tied body device propagation delay value may be obtained for use in characterizing the floating body effects at 414. Thus, for instance, the method 400 may comprise coupling first and last tied body devices in the tied body chain to form a tied body chain ring oscillator, measuring a tied body device propagation delay value using the tied body chain ring oscillator, and decoupling the first and last tied body devices from one another in the tied body chain. In this example, the determination of the floating body delay value at 414 comprises determining the floating body delay value according to the first and second values and according to the tied body device propagation delay value.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. Test apparatus for use in characterizing floating body delay effects in an SOI wafer, comprising:
a floating body chain comprising a plurality of floating body devices fabricated in series with one another in the wafer,
a tied body chain comprising a plurality of tied body devices fabricated in series with one another in the wafer; and
a plurality of storage devices individually coupled with the plurality of tied body devices and with at least one of the floating body devices, the plurality of storage devices being adapted to store tied body chain data from the plurality of tied body devices according to the at least one of the floating body devices.

2. The apparatus of claim 1, wherein the floating body chain comprises one of a plurality of series coupled floating body inverter devices and a plurality of series coupled floating body NAND gate devices, wherein the floating body devices individually comprise floating body MOS transistors fabricated in the wafer.

3. The apparatus of claim 2, wherein the tied body chain comprises a plurality of series coupled floating body inverter devices and wherein the tied body inverter devices individually comprise tied body MOS transistors fabricated in the wafer.

4. The apparatus of claim 3, wherein the floating body chain comprises a plurality of series coupled floating body inverter devices.

5. The apparatus of claim 2, wherein the floating body chain comprises a plurality of series coupled floating body inverter devices.

6. The apparatus of claim 1, further comprising a ring oscillator circuit operatively coupled with the tied body chain and adapted to selectively couple an input of a first tied body device with an output of a last tied body device in the tied body chain such that the tied body devices are series connected in a ring, wherein the tied body chain operates as an oscillator when the ring oscillator circuit couples the first and last tied body devices.

7. The apparatus of claim 6, wherein the ring oscillator circuit comprises a frequency counter receiving an output of one of the tied body devices in the tied body chain and a buffer receiving a divided count of transitions on the output of the tied body device from the frequency counter.

8. The apparatus of claim 1:
wherein the floating body chain comprises:
a first floating body device having an input for receiving an input pulse edge from a pulse generator;
a last floating body device; and
a plurality of intermediate floating body devices serially connected between the first and last floating body devices;
wherein the plurality of storage devices comprises:
a first set of storage devices individually coupled with odd numbered ones of the plurality of tied body devices and adapted to store tied body chain data from the odd numbered ones of the plurality of tied body devices according to a first control signal from a first one of the intermediate floating body devices in the floating body chain; and
a second set of storage devices individually coupled with even numbered ones of the plurality of tied body devices and adapted to store tied body chain data from the even numbered ones of the plurality of tied body devices according to a second control signal from a second one of the intermediate floating body devices in the floating body chain; and
wherein the first one of the intermediate floating body devices is nearer to the first floating body device than is the second one of the intermediate floating body devices in the floating body chain.

9. The apparatus of claim 8, comprising:
a data interface formed in the wafer and being coupled with the plurality of storage devices, and operable to receive the tied body chain data from the plurality of storage devices, and to provide access to the tied body chain data to an external test device;

a pulse input pad formed in the wafer and being coupled with an input of a first one of the plurality of floating body devices and coupled with an input of a first one of the plurality of tied body devices to provide a pulse edge from a pulse generator to the first ones of the floating body devices and the tied body devices; and a pair of power connection pads coupled with power terminals of the devices in the wafer, and operable to provide electrical power to the devices in the wafer by an external power source.

10. The apparatus of claim 8, wherein the floating body chain comprises one of a plurality of series coupled floating body inverter devices and a plurality of series coupled floating body NAND gate devices, wherein the floating body devices individually comprise floating body MOS transistors fabricated in the wafer.

11. The apparatus of claim 10, wherein the tied body chain comprises a plurality of series coupled floating body inverter devices and wherein the tied body inverter devices individually comprise tied body MOS transistors fabricated in the wafer.

12. A test system for characterizing floating body delay effects in an SOI wafer, comprising:

a floating body chain comprising a plurality of floating body devices fabricated in series with one another in the wafer;

a tied body chain comprising a plurality of tied body devices fabricated in series with one another in the wafer, a plurality of storage devices individually coupled with the plurality of tied body devices and with at least one of the floating body devices, the plurality of storage devices being adapted to store tied body chain data from the plurality of tied body devices according to at least one of the floating body devices in the floating body chain; and a tester comprising:
a pulse generator coupleable to the floating body chain and to the tied body chain to provide a pulse edge to first devices in the floating body chain and in the tied body chain;
a processor coupleable to the plurality of storage devices to receive stored tied body chain data therefrom; and
a power source coupleable to power terminals of devices in the wafer to provide electrical power thereto;

wherein the processor controls the pulse generator to selectively provide one or more pulse edges to the floating body and tied body chains and wherein the processor determines at least one floating body delay according to the tied body chain data from the plurality of storage devices.

13. A method of fabricating an SOI wafer, comprising:
providing a plurality of series connected floating body devices in the wafer to form a floating body chain;
providing a plurality of series connected tied body devices in the wafer to form a tied body chain;
providing at least one pulse input pad in the wafer, the pulse input pad being coupled with a first one of the floating body devices and with a first one of the tied body devices;
providing a plurality of storage devices in the wafer, the storage devices being individually coupled with the tied body devices and with at least one of the floating body devices, wherein the plurality of storage devices store tied body chain data from the tied body devices according to the at least one of the series connected floating body devices in the floating body chain; and providing an interface coupled with the plurality of storage devices in the wafer to provide external access to the tied body chain data.

14. A test method for characterizing floating body delay effects in an SOI wafer, the method comprising:
providing a pulse edge to a floating body chain comprising a plurality of series connected floating body devices in the SOI wafer and to a tied body chain comprising a plurality of series connected tied body devices in the SOI wafer;
storing tied body chain data from the plurality of series connected tied body devices according to at least one of the floating body devices; and
characterizing floating body delay effects in an SOI wafer according to stored tied body chain data from the plurality of series connected tied body devices.

15. The method of claim 14, wherein characterizing floating body delay effects in an SOI wafer comprises determining a floating body delay value according to stored tied body chain data.

16. The method of claim 15, wherein storing the tied body chain data comprises:
storing first tied body chain data according to a first floating body device in the floating body chain; and
storing second tied body chain data according to a second floating body device in the floating body chain after storing the first tied body chain data.

17. The method of claim 16, wherein storing the first tied body chain data comprises storing data states from the tied body devices when the pulse edge propagates through the floating body chain to the first floating body device thereof, and wherein storing the second tied body chain data comprises storing data states from the tied body devices when the pulse edge propagates through the floating body chain to the second floating body device.

18. The method of claim 17, wherein determining the floating body delay value according to stored tied body chain data comprises:
determining a first value representing a number of tied body devices in the tied body chain to which the pulse edge has propagated in the first tied body chain data;
determining a second value representing a number of tied body devices in the tied body chain to which the pulse edge has propagated in the second tied body chain data; and
determining the floating body delay value according to the first and second values.

19. The method of claim 18, wherein storing the first tied body chain data comprises storing data states from odd numbered tied body devices in the tied body chain, and wherein storing the second tied body chain data comprises storing data states from even numbered tied body devices in the tied body chain.

20. The method of claim 19, further comprising:
coupling first and last tied body devices in the tied body chain to form a tied body chain ring oscillator;
measuring a tied body device propagation delay value using the tied body chain ring oscillator; and
decoupling the first and last tied body devices from one another in the tied body chain;

wherein determining the floating body delay value comprises determining the floating body delay value according to the first and second values and according to the tied body device propagation delay value.

21. The method of claim 19, further comprising providing at least one preconditioning pulse to the floating body chain and to the tied body chain before providing the pulse edge.

22. The method of claim 16, wherein storing the first tied body chain data comprises storing data states from odd numbered tied body devices in the tied body chain, and wherein storing the second tied body chain data comprises storing data states from even numbered tied body devices in the tied body chain.

23. The method of claim 16, further comprising:

coupling first and last tied body devices in the tied body chain to form a tied body chain ring oscillator;

measuring a tied body device propagation delay value using the tied body chain ring oscillator; and decoupling the first and last tied body devices from one another in the tied body chain;

wherein determining the floating body delay value comprises determining the floating body delay value according to stored tied body chain data and according to the tied body device propagation delay value.

24. The method of claim 16, further comprising providing at least one preconditioning pulse to the floating body chain and to the tied body chain before providing the pulse edge.

25. The method of claim 14, further comprising providing at least one preconditioning pulse to the floating body chain and to the tied body chain before providing the pulse edge.

* * * * *